US012713891B2

(12) United States Patent
Kuo et al.

(10) Patent No.: US 12,713,891 B2
(45) Date of Patent: Aug. 18, 2026

(54) ELECTRONIC DEVICE

(71) Applicant: Advanced Semiconductor Engineering, Inc., Kaohsiung (TW)

(72) Inventors: Chiung-Ying Kuo, Kaohsiung (TW); Jung Jui Kang, Kaohsiung (TW); Hung-Chun Kuo, Kaohsiung (TW); Chun-Yen Ting, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 397 days.

(21) Appl. No.: 18/369,109

(22) Filed: Sep. 15, 2023

(65) Prior Publication Data

US 2025/0096073 A1 Mar. 20, 2025

(51) Int. Cl.

| | |
|---|---|
| ***H10W 20/20*** | (2026.01) |
| ***H05K 1/02*** | (2006.01) |
| ***H10W 20/41*** | (2026.01) |
| ***H10W 42/20*** | (2026.01) |

(52) U.S. Cl.

CPC .......... *H10W 20/20* (2026.01); *H05K 1/0231* (2013.01); *H10W 42/20* (2026.01)

(58) Field of Classification Search

CPC . H01L 23/481; H01L 23/552; H01L 23/5286; H05K 1/0231; H10W 20/20; H10W 42/20; H10W 20/427

See application file for complete search history.

(56) References Cited

U.S. PATENT DOCUMENTS

| | | | |
|---|---|---|---|
| 10,658,291 B2 | 5/2020 | Nelson et al. | |
| 2012/0292777 A1 | 11/2012 | Lotz | |
| 2021/0050318 A1* | 2/2021 | Marquart | H01L 25/0655 |
| 2022/0181258 A1* | 6/2022 | Liebmann | H10D 30/67 |

OTHER PUBLICATIONS

U.S. Appl. No. 17/846,642, filed Jun. 22, 2022, Ting et al.

* cited by examiner

*Primary Examiner* — Herve-Louis Y Assouman
(74) *Attorney, Agent, or Firm* — Foley and Lardner LLP

(57) ABSTRACT

An electronic device is disclosed. The electronic component has a front side and a backside opposite to the front side. The front side is configured to receive a first power. The backside is configured to receive a second power greater than the first power.

12 Claims, 27 Drawing Sheets

51t
43
61
1n
80
51

ELECTRONIC DEVICE

BACKGROUND

1. Field of the Disclosure

The present disclosure generally relates to an electronic device.

2. Description of the Related Art

High performance computing (HPC) systems for electronic devices impose challenging demands on power consumption and heat dissipation characteristics of power supply units. Power routing paths for transmitting power signals are usually provided by a system board, over which several dies are mounted. Layout design may be constrained by the need to minimize electromagnetic interference between power signals and non-power signals (e.g., electrical signals), which can limit the ability to miniaturize the system board.

The voltage and power requirements of the dies vary, and the inevitable expansion in the total number and variety of dies has led to a corresponding increase in the number of power routing paths. One approach to providing more stabilized power routing paths is to provide power through the power regulating components over an interconnection structure or an interconnection die. However, this may increase the size of the electronic device and put undesirable constraints on miniaturization of the electronic device.

SUMMARY

In some embodiments, an electronic device includes an electronic component. The electronic component has a front side and a backside opposite to the front side. The front side is configured to receive a first power. The backside is configured to receive a second power greater than the first power.

In some embodiments, an electronic device includes a logic circuit, a first circuit, and a second circuit. The logic circuit includes a first functional region. The first circuit is under the logic circuit and configured to provide the first functional region with a first power. The second circuit is over the logic circuit and configured to provide the first functional region with a second power.

In some embodiments, an electronic device includes an electronic component, a first circuit, and a second circuit. The electronic component has a front side and a backside. The first circuit is under the front side and configured to provide a first functional region of the electronic component with a first power. The second circuit is over the backside side and configured to provide a second functional region of the electronic component with a second power. A line width/line space (L/S) of the first circuit is less than that of the second circuit.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
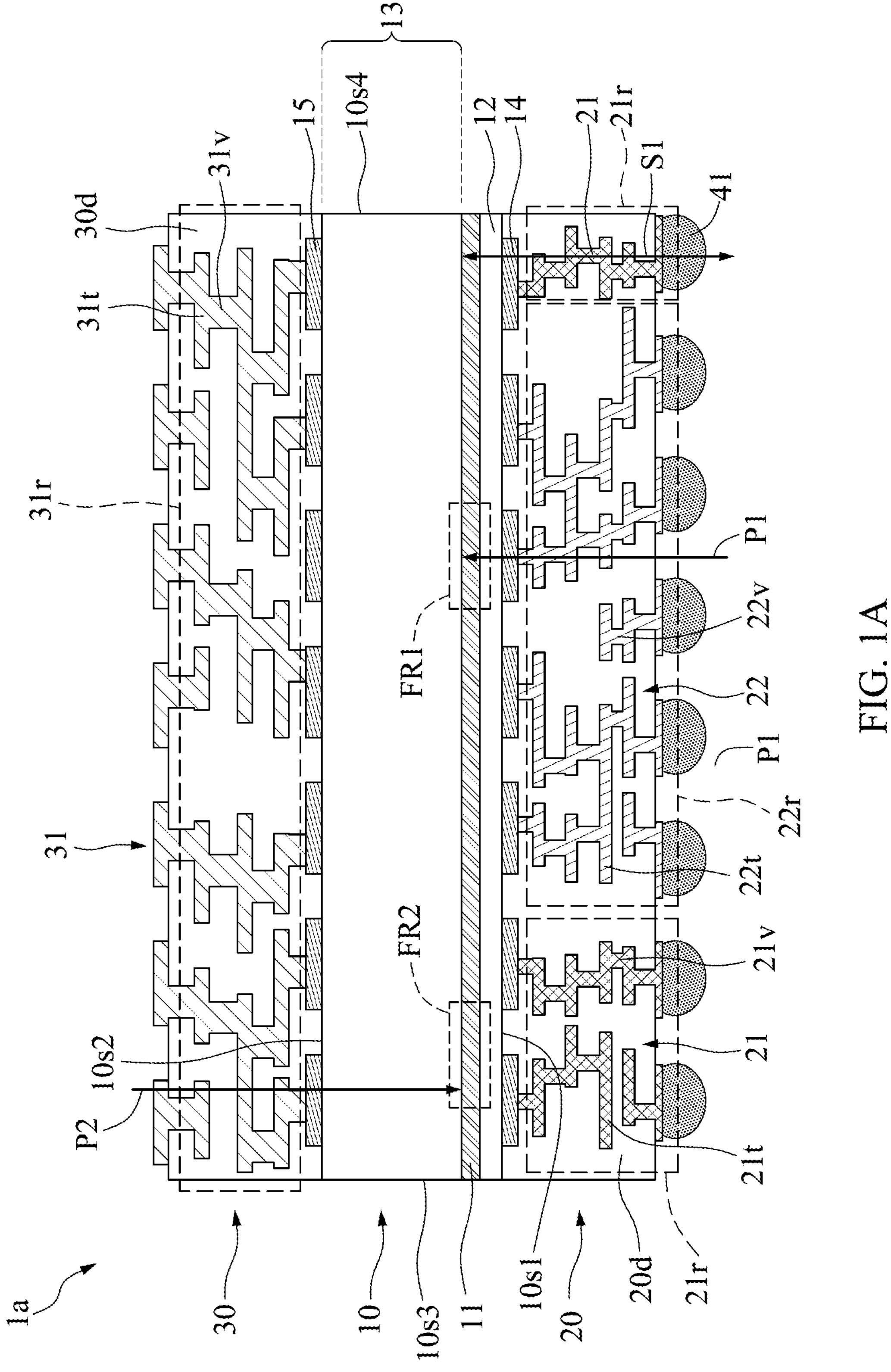
FIG. 1A illustrates a cross-sectional view of an electronic device according to some embodiments of the present disclosure.

Common reference numerals are used throughout the drawings and the detailed description to indicate the same or similar components. Arrangements of the present disclosure will be readily understood from the following detailed description taken in conjunction with the accompanying drawings.

The following disclosure provides many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

Figure 1B:
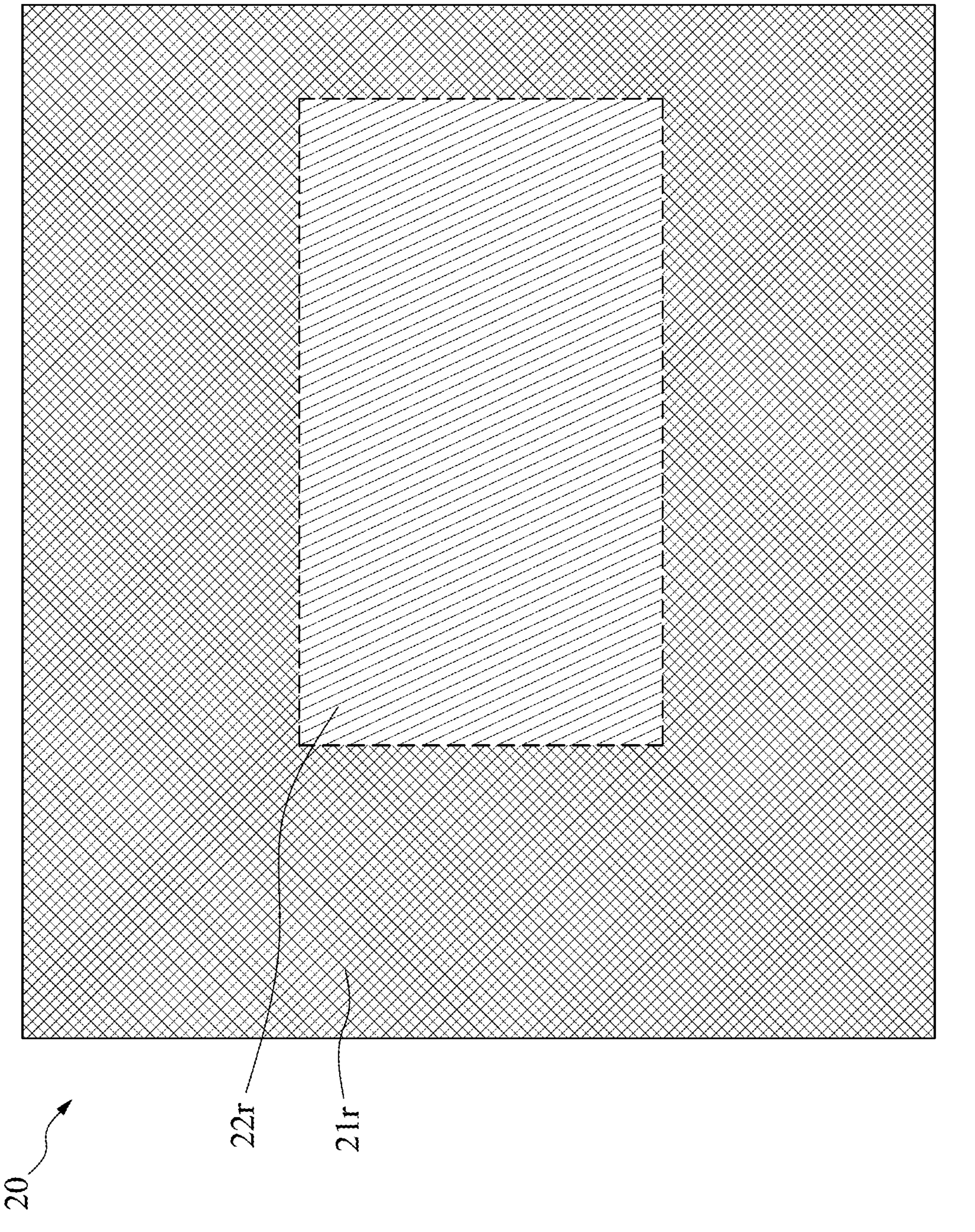
FIG. 1B illustrates a layout of the electronic device as shown in FIG. 1A according to some embodiments of the present disclosure.
Figure 1C:
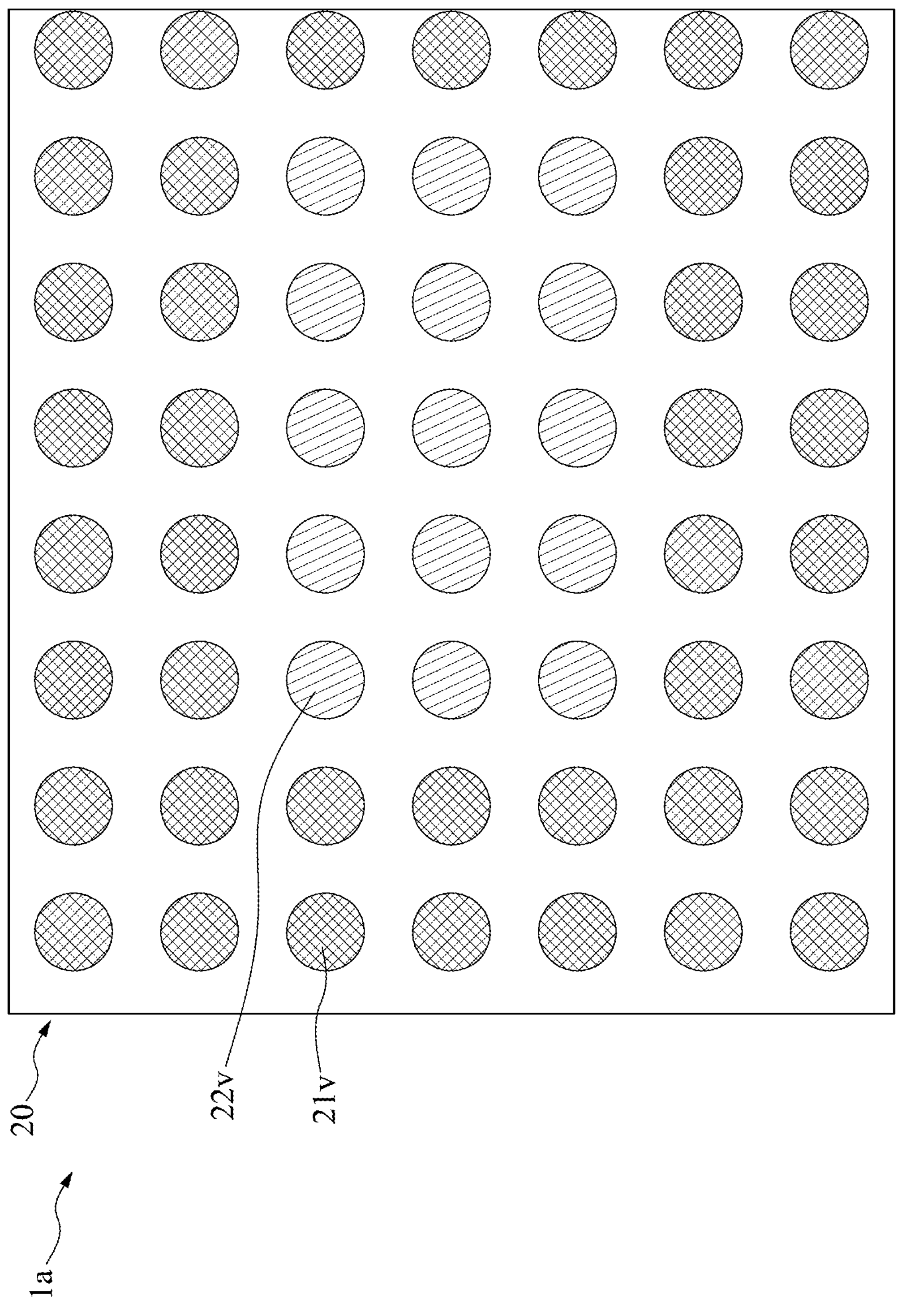
FIG. 1C illustrates a layout of the electronic device as shown in FIG. 1A according to some embodiments of the present disclosure.

FIG. 1A, FIG. 1B, and FIG. 1C illustrate an electronic device 1*a* according to some embodiments of the present disclosure. As shown in FIG. 1A, the electronic device 1*a* may include an electronic component 10, a circuit 20, and a circuit 30.

The electronic component 10 may include a chip. The electronic component 10 may include an active component that relies on an external power supply to control, output, or modify electrical signals (e.g., non-power signals). For example, the electronic component 10 may include a processor, a controller, a memory, an input/output (I/O) buffer, etc. The electronic component 10 may include a system on chip (SoC), a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit.

The electronic component 10 may include a surface 10*s*1 (or a lower surface or a front side) and a surface 10*s*2 (or an upper surface or a backside) opposite to the surface 10*s*1. The electronic component 10 may include a surface 10*s*3 (or a lateral surface) extending between the surface 10*s*1 and surface 10*s*2. The electronic component 10 may include a surface 10*s*4 (or a lateral surface) opposite to the surface 10*s*3. As used herein, the term "front side" may refer to a surface on which semiconductor operations configured to form ICs are performed.

In some embodiments, the surface 10*s*1 may be configured to transmit and/or receive a non-power signal (e.g., an input/output (I/O) signal), which may include or be composed of alternating current (AC), in communication between and/or among chips. In some embodiments, the surface 10*s*1 may be further configured to transmit or receive power (or a power signal), which may include or be composed of direct current (DC). In some embodiments, the surface 10*s*2 may be configured to transmit or receive power (or a power signal). As used herein, the term "power" may refer to energy configured to turn on, turn off, keep, and/or maintain the operation of ICs. In some cases, the term "power" may be replaced by "voltage."

The electronic component 10 may include a circuit layer 11, a redistribution structure 12, and a redistribution structure 13. The circuit layer 11 may be disposed adjacent to the surface 10*s*1 of the electronic component 10. The circuit layer 11 may include one or more ICs, such as a logic circuit (or a logic portion), a memory circuit, or other suitable circuits. The logic circuit may include at least one transistor and/or other elements. The circuit layer 11 may also include passive circuits, such as a resistor, a capacitor, an inductor, or a combination thereof. The circuit layer 11 may be at least partially disposed within a semiconductor substrate (e.g., a silicon substrate). In some embodiments, the circuit layer 11 may include a functional region FR1 and a functional region FR2 distinct from the functional region FR1. In some embodiments, the functional regions FR1 and FR2 receive different powers (or voltages).

The redistribution structure 12 may be adjacent to the surface 10*s*1 of the electronic component 10. The redistribution structure 12 may be disposed between the circuit layer 11 and the surface 10*s*1. The redistribution structure 12 may include a fan-in structure. The redistribution structure 12 may include a conductive trace(s), a conductive via(s), and/or other suitable conductive elements embedded within or exposed by a dielectric structure.

The redistribution structure 13 may be adjacent to the surface 10*s*2 of the electronic component 10. The redistribution structure 13 may be disposed between the circuit layer 11 and the surface 10*s*2. The redistribution structure 13 may include a conductive trace(s), a conductive via(s), and/or other suitable conductive elements embedded within or exposed by a dielectric structure. The redistribution structure 13 may include a backside through silicon via (not shown) within a semiconductor substrate.

The electronic component 10 may include terminals 14 and 15. The terminal 14 may be adjacent to and/or at least partially exposed by the surface 10*s*1 of the electronic component 10. The terminal 15 may be adjacent to and/or at least partially exposed by the surface 10*s*2 of the electronic component 10. The terminal 14 and/or 15 may be configured to electrically connect the electronic component 10 to other circuits or devices by a flip-chip bonding technique, a hybrid bonding technique, or other suitable techniques.

The circuit 20 may be disposed on or under the surface 10*s*1 of the electronic component 10. In some embodiments, the circuit 20 may include a redistribution structure. In some embodiments, the circuit 20 may include a fan-out structure. The circuit 20 may include one or more dielectric layers (e.g., a dielectric structure 20*d*) as well as conductive trace(s), conductive pad(s), and/or conductive via(s) embedded in or disposed on the dielectric layer(s). In some embodiments, the circuit 20 may include a conductive structure 21 and a conductive structure 22.

The conductive structure 21 may be located within a region 21*r* (or a circuit region) of the circuit 20. The conductive structure 21 may include one or more conductive traces 21*t*, conductive vias 21*v*, and/or other suitable conductive elements. In some embodiments, the conductive structure 21 may be configured to transceive (e.g., transmit and/or receive) a non-power signal, such as an I/O signal. In some embodiments, the electronic device 1*a* includes a path S1 for transmitting a non-power signal. In some embodiments, the path S1 may pass through the surface 10*s*1 of the electronic component 10 and conductive structure 21 (or region 21*r*). As used herein, the term "region" or "circuit region" may refer to an imaginary area or boundary that can enclose, encompass, or overlap a specific conductive structure configured to transceive power or a signal to and/or from a corresponding functional region of the electronic component 10.

The conductive structure 22 may be located within a region 22*r* of the circuit 20. The conductive structure 22 may include one or more conductive traces 22*t*, conductive vias 22*v*, and/or other suitable conductive elements. In some embodiments, the conductive structure 22 may be configured to transceive power, such as a power signal. In some embodiments, the electronic device 1*a* includes a path P1 for transmitting power with a relatively small energy or voltage, such as a voltage less than 3.3V, 3V, 2.5V, 2V, 1V, or less, to the function region FR1. The path P1 may pass through the surface 10*s*1 of the electronic component 10 and the conductive structure 22 (or region 22*r*). The region 22*r* may be surrounded by the region 21*r*. The region 21*r* may be closer to the surface 10*s*3 (or surface 10*s*4) than the region 22*r* is. The region 21*r* may function as a signal transmission region, and the region 22*r* may function as a power transmission region.

Referring to FIG. 1B, the region 21*r* may be disposed at a peripheral region of the circuit 20, and the region 22*r* may be disposed at a central region of the circuit 20. In this condition, I/O signals can be free of interference caused by the conductive structure 22 when the conductive structure 21 is fanned out.

Referring to FIG. 1C, the conductive vias 22*v* may be surrounded by the conductive vias 21*v*. In some embodiments, the pitch of the conductive vias 22*v* may be substantially the same as the pitch of the conductive vias 21*v*. In some embodiments, the dimension (e.g., aperture or surface area) of the conductive via 22*v* may be substantially the same as the dimension of the conductive via 21*v*.

The circuit 30 may be disposed on or over the surface 10*s*2 of the electronic component 10. In some embodiments, the circuit 30 may include a redistribution structure. In some embodiments, the circuit 30 may include a fan-out structure. The circuit 30 may include one or more dielectric layers (e.g., a dielectric structure 30*d*) as well as conductive traces 31*t*, conductive vias 31*v*, and/or other suitable elements embedded in or disposed on the dielectric layer(s). In some embodiments, the circuit 30 may include a conductive structure 31. The conductive structure 31 may include the conductive traces 31*t* and conductive vias 31*v*. The conductive structure 31 may be located within a region 31*r* of the circuit 30. In some embodiments, the conductive structure 31 may be configured to transceive power, such as a power signal. In some embodiments, the electronic device 1*a* includes a path P2 for transmitting power with a relatively large energy or voltage, such as a voltage greater than 3.3V, 3.6V, 4V, 5V, or more, to the function region FR2. The path P2 may pass through the surface 10*s*2 of the electronic component 10 and the conductive structure 31 (or region 31*r*). In some embodiments, the region 31*r* may vertically overlap the functional region FR1. In some embodiments, the region 31*r* may vertically overlap the functional region FR2. In some embodiments, the region 31*r* may vertically overlap the region 21*r*. In some embodiments, the region 31*r* may vertically overlap the region 22*r*.

In some embodiments, the conductive elements of the circuits 20 and 30 may have different dimensions. In some embodiments, the line width/line space (L/S) of the conductive element of the circuit 20 may be less than that of the circuit 30. For example, the conductive traces 21*t* and 22*t* (or the conductive vias 21*v* and 22*v*) of the circuit 20 may have a dimension (or an average dimension) (e.g., width, diameter, and/or surface area) less than that of the conductive trace 31*t* (or conductive via 31*v*). In some embodiments, the conductive elements of the circuits 20 and 30 may have different densities (e.g., the number of conductive elements per unit area). In some embodiments, the density of the circuit 20 may be greater than that of the circuit 30. For example, the conductive traces 21*t* and 22*t* (or the conductive vias 21*v* and 22*v*) of the circuit 20 may have a density greater than that of the conductive trace 31*t* (or the conductive via 31*v*) of the circuit 30. Although FIG. 1A illustrates that the conductive element (e.g., conductive trace 21*t*) of the circuit 20 may have a thickness less than that of the conductive element (e.g., conductive trace 31*t*) of the circuit 30, the conductive element (e.g., conductive trace 21*t*) of the circuit 20 may have a thickness substantially equal to that of the circuit 30 in other embodiments. As used herein, the term "density" may refer to the number of conductive elements, such as conductive traces and/or conductive vias, per unit area. Further, the density of the circuit may refer to a metal coverage percentage per unit area. In some embodiments, the density of the circuit may be negatively proportional to the line width/line space (L/S), thickness, and/or aperture of the conductive element.

In some embodiments, the electronic device 1*a* may include terminals 41. The terminal 41 may be disposed on or under the circuit 20. The circuit 20 may be configured to electrically connect the electronic device 1*a* to an external device, such as a printed circuit board, die, interposer, or other suitable elements. In some embodiments, the terminal 41 may include a solder ball, such as a controlled collapse chip connection (C4) bump, a ball grid array (BGA), a land grid array (LGA), or so on. In some embodiments, the terminal 41 may include a solder material(s), which may include alloys of gold and tin solder or alloys of silver and tin solder, or other suitable materials.

Figure 2:
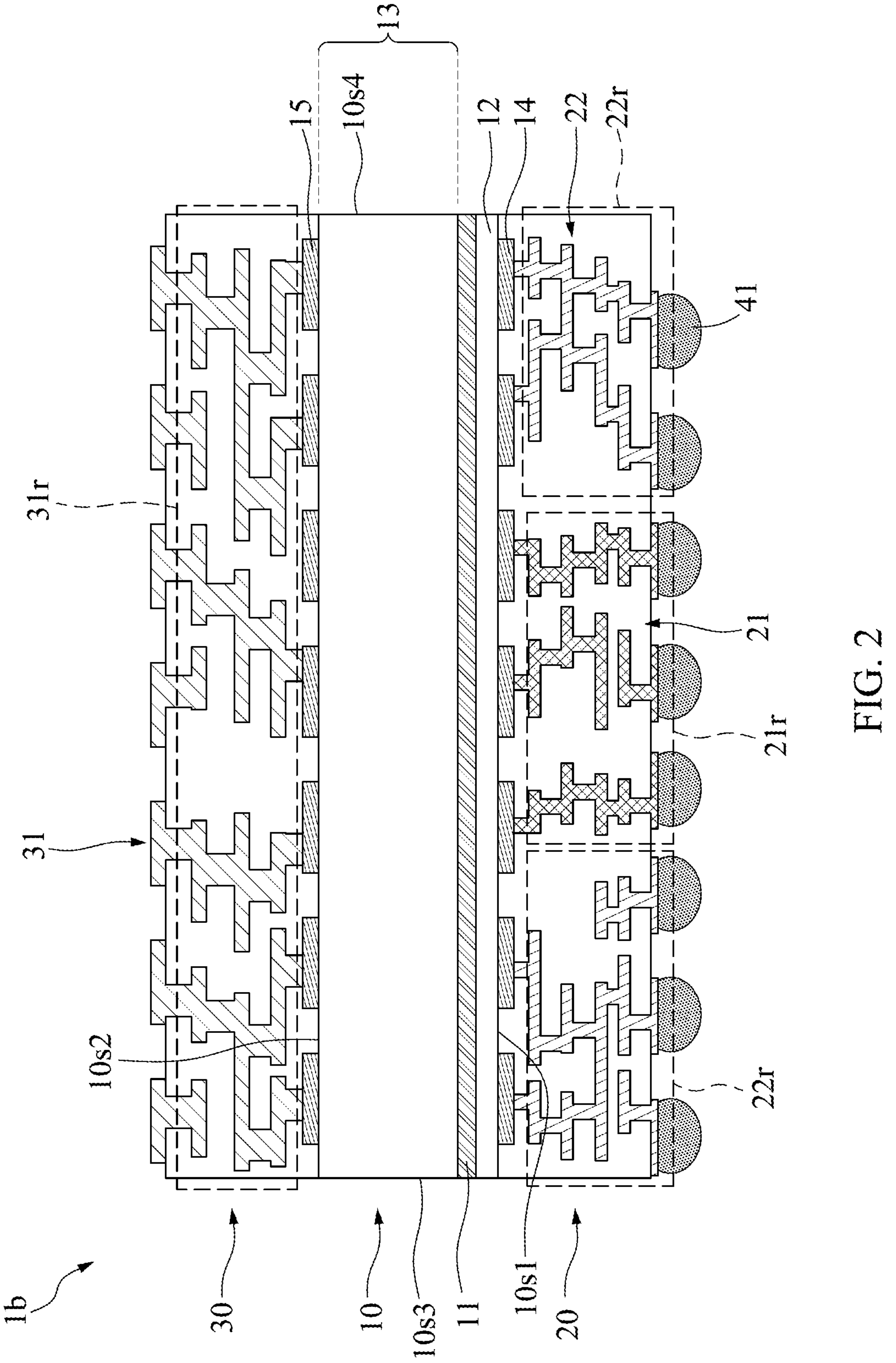
FIG. 2 illustrates a cross-sectional view of an electronic device according to some embodiments of the present disclosure.

FIG. 2 illustrates a cross-sectional view of an electronic device 1*b* according to some embodiments of the present disclosure. The electronic device 1*b* is similar to the electronic device 1*a* as shown in FIG. 1A, with differences therebetween as follows.

In some embodiments, the region 22*r* is closer to the surface 10*s*3 (or surface 10*s*4) of the electronic component 10 than the region 21*r* is. The region 22*r* may surround the region 21*r*. In this embodiment, the region 22*r* may be located at a peripheral region of the circuit 20, and the region 21*r* may be located at a central region of the circuit 20.

Figure 3A:
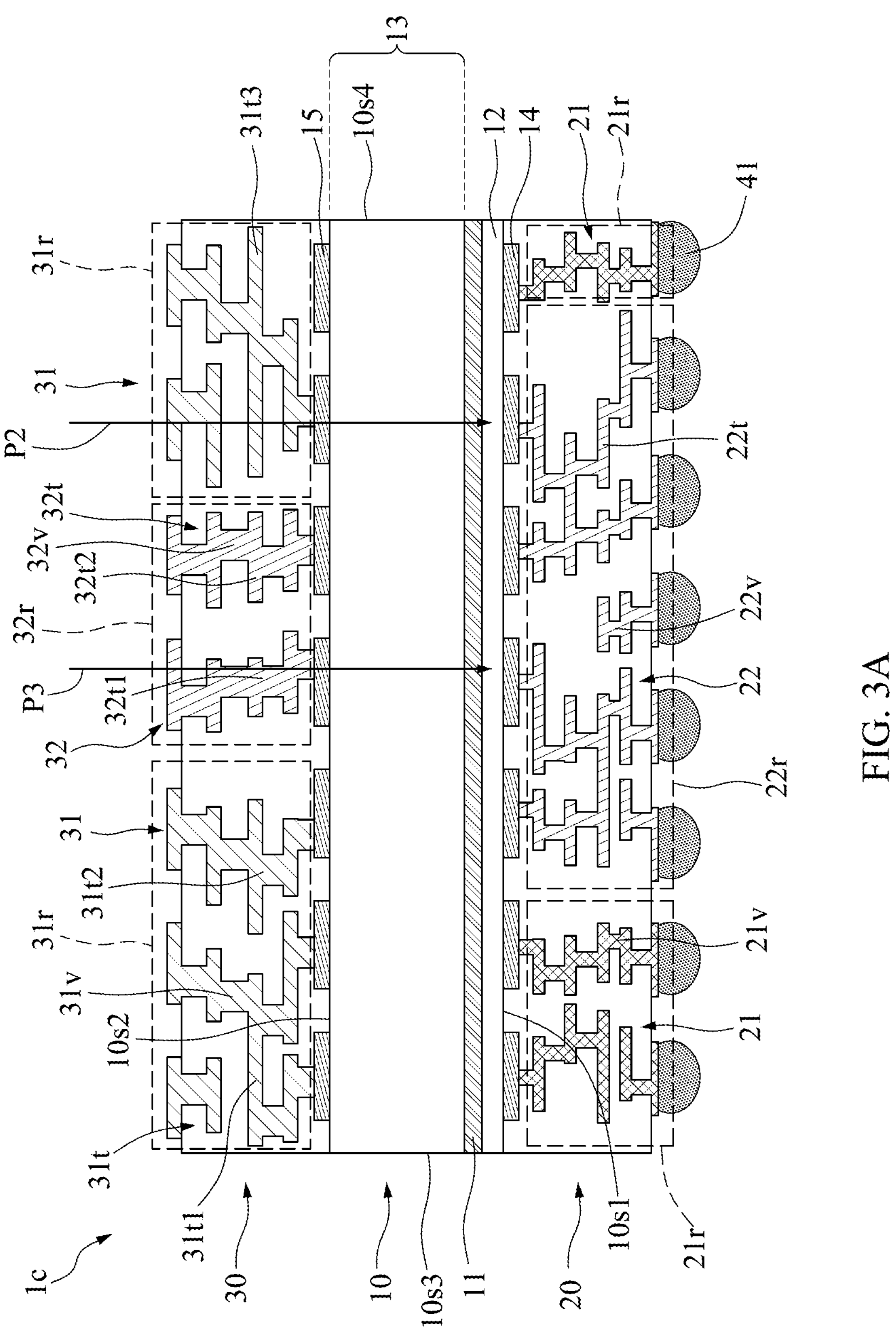
FIG. 3A illustrates a cross-sectional view of an electronic device according to some embodiments of the present disclosure.
Figure 3B:
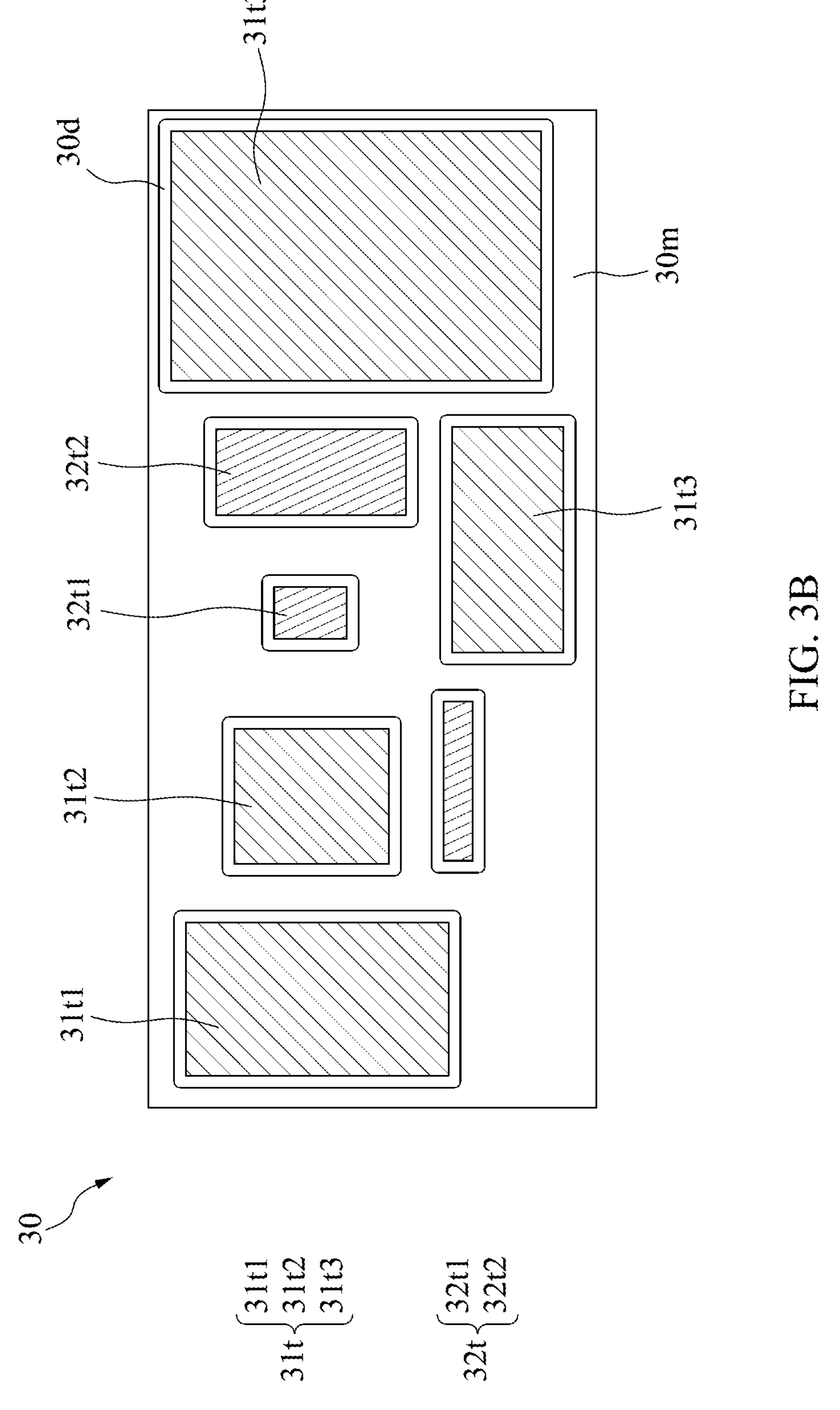
FIG. 3B illustrates a layout of the electronic device as shown in FIG. 3A according to some embodiments of the present disclosure.

FIG. 3A and FIG. 3B illustrate an electronic device 1*c* according to some embodiments of the present disclosure. The electronic device 1*c* is similar to the electronic device 1*a* as shown in FIG. 1A, with differences therebetween as follows. It should be noted that some elements, such as grounding traces or grounding pads, are not shown in FIG. 3A but are shown in FIG. 3B for brevity.

Referring to FIG. 3A, the circuit 30 may further include a conductive structure 32. The conductive structure 32 may include one or more conductive traces 32*t*, conductive vias 32*v*, and/or other suitable conductive elements. The conductive structure 32 may be located within a region 32*r*. In some embodiments, the region 32*r* may be located at a central region of the circuit 30, and the region 31*r* may be located at a peripheral region of the circuit 30. In some embodiments, the conductive structure 32 may be configured to transceive power, such as a power signal. In some embodiments, the electronic device 1*a* includes a path P3 for transmitting power with a relatively small energy or voltage, such as a voltage less than 3.3V, 3V, 2.5V, 2V, 1V, or less. The path P3 may pass through the surface 10*s*2 of the electronic component 10 and the conductive structure 32 (or region 32*r*). The region 32*r* may be surrounded by the region 31*r*.

In some embodiments, the conductive trace 22*t* (or conductive via 22*v*) may have a dimension (or an average dimension) (e.g., width, diameter, and/or surface area) less than that of the conductive trace 32*t* (or conductive via 32*v*). In some embodiments, the conductive trace 22*t* (or conductive via 22*v*) may have a density greater than that of the conductive trace 32*t* (or the conductive via 32*v*). In some embodiments, the conductive trace 32*t* may have a thickness greater than that of the conductive trace 22*t*.

Referring to FIG. 3B, the conductive trace 31*t* may include segment 31*t*1, segment 31*t*2, segment 31*t*3, and other segments. The conductive trace 32*t* may include segment 32*t*1, segment 32*t*2, and other segments. Each of the segments 31*t*1, 31*t*2, 31*t*3, 32*t*1, and 32*t*2 may function as an impedance matching trace, which is designed for transmitting power with less power loss. Each of the segments 31*t*1, 31*t*2, 31*t*3, 32*t*1, and 32*t*2 may be an interlayer which is neither the bottommost nor the topmost layer exposed by the dielectric structure 30*d*. In some embodiments, the segment 31*t*1, segment 31*t*2, and segment 31*t*3 may have a dimension (or an average dimension) (e.g., surface area) greater than that of the segment 32*t*1 and segment 32*t*2. As described above, the conductive structure 31 is configured to transceive greater power than the conductive structure 32 is. A trace with a greater surface area may have a lower impedance, leading to a reduced power loss for transmitting greater power. In some embodiments, the circuit 30 may have a ground pattern 30*m*. The ground pattern 30*m* may be configured to transmit or receive a grounding signal. The ground pattern 30*m* may be electrically connected to ground. The ground pattern 30*m* may be exposed by a lateral surface (not annotated) of the dielectric structure 30*d*. The ground pattern 30*m* may be spaced apart from the segment 31*t*1 by the dielectric structure 30*d*.

Figure 4:
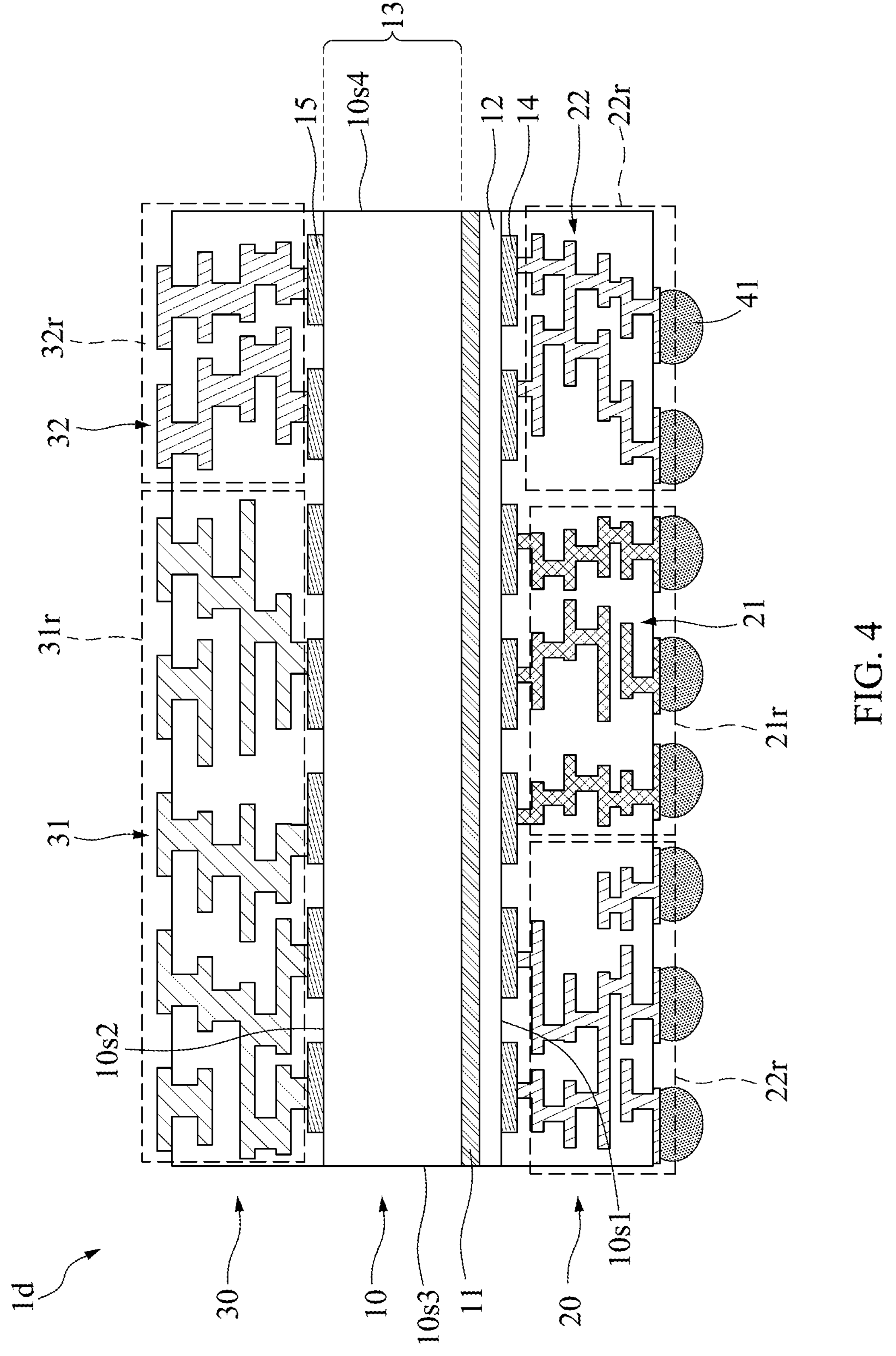
FIG. 4 illustrates a cross-sectional view of an electronic device according to some embodiments of the present disclosure.

FIG. 4 illustrates a cross-sectional view of an electronic device according to some embodiments of the present disclosure. The electronic device 1*d* is similar to the electronic device 1*c* as shown in FIG. 1C, with differences therebetween as follows.

In some embodiments, the region 32*r* may be closer to the surface 10*s*4, and the region 31*r* may be closer to the surface 10*s*3.

Figure 5A:
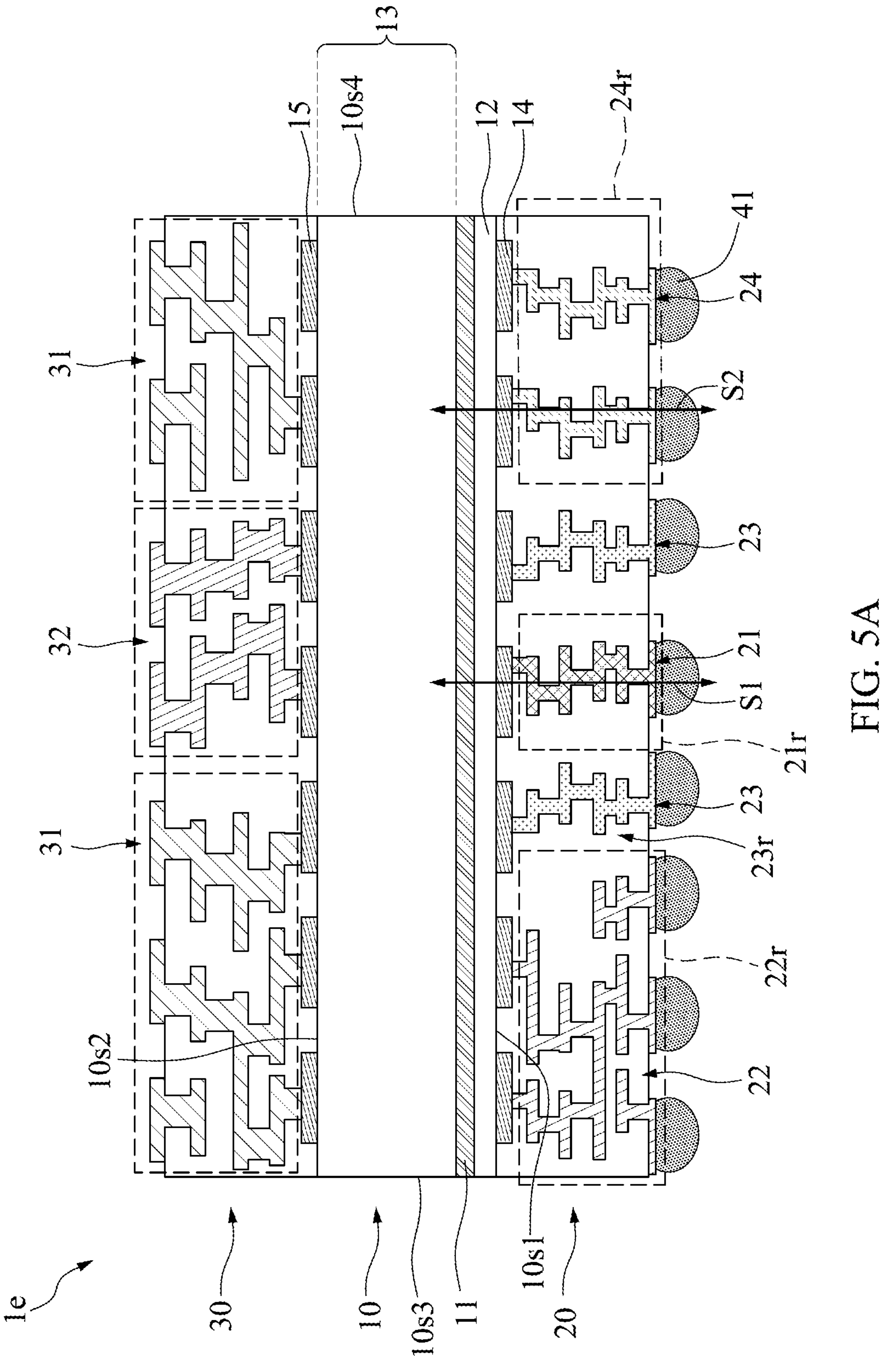
FIG. 5A illustrates a cross-sectional view of an electronic device according to some embodiments of the present disclosure.
Figure 5B:
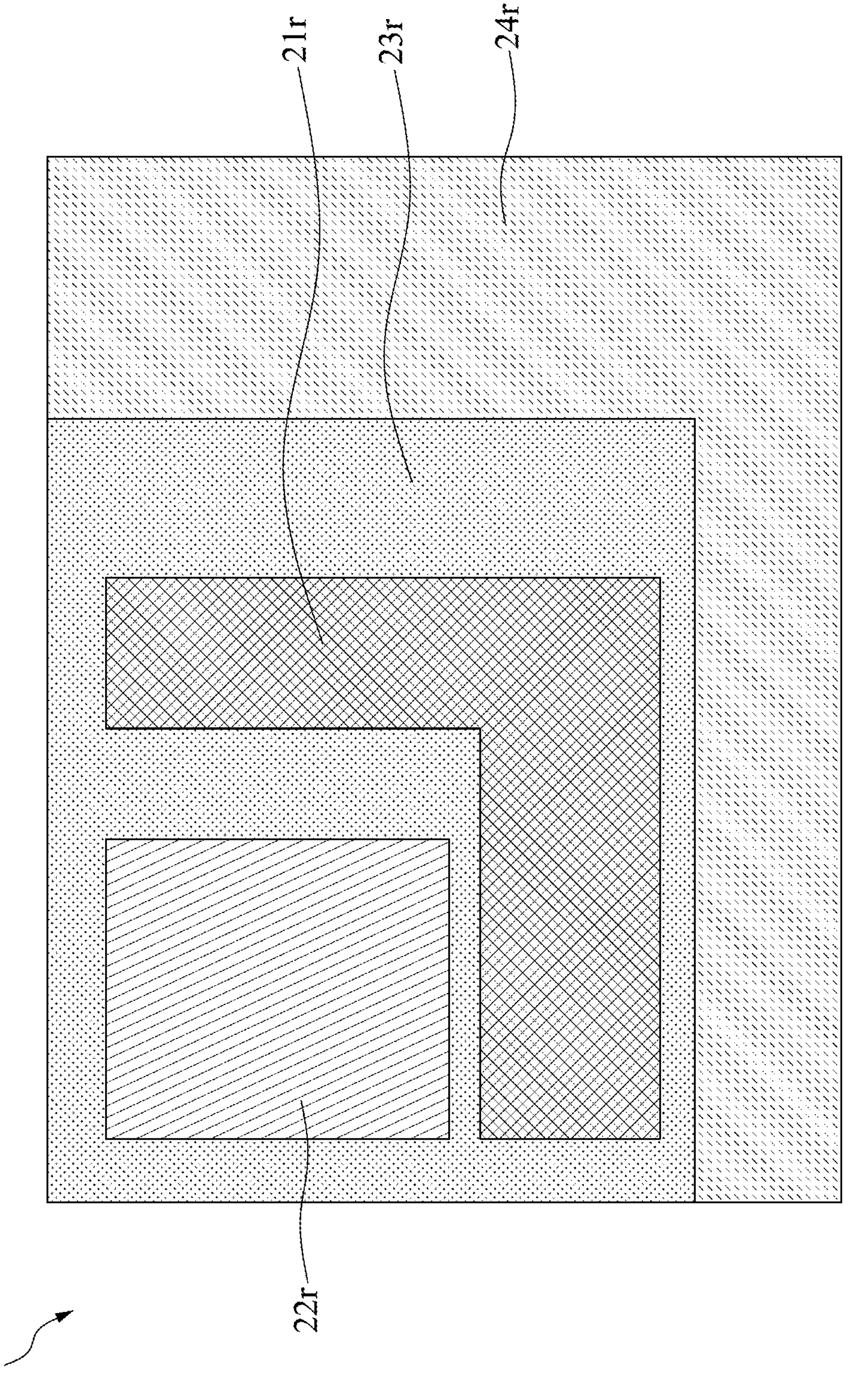
FIG. 5B illustrates a layout of the electronic device as shown in FIG. 5A according to some embodiments of the present disclosure.

FIG. 5A and FIG. 5B illustrate an electronic device 1*e* according to some embodiments of the present disclosure. The electronic device 1*e* is similar to the electronic device 1*b* as shown in FIG. 1B, with differences therebetween as follows.

Referring to FIG. 5A, the circuit 20 may include a conductive structure 23 and a conductive structure 24. The conductive structure 23 may be located within a region 23*r*. The conductive structure 23 may be configured to transmit or receive a grounding signal. The conductive structure 23 may be electrically connected to ground.

The conductive structure 24 may be located within a region 24*r* of the circuit 20. In some embodiments, the conductive structure 24 may be configured to transceive a non-power signal, such as an I/O signal. In some embodiments, the electronic device 1*a* includes a path S2 for transmitting a signal. In some embodiments, the path S2 may pass through the surface 10*s*1 of the electronic component 10 and conductive structure 24 (or region 24*r*). In some embodiments, a data rate of the signal of the path S2 may be different from the data rate of the signal of the path S1. In some embodiments, a data rate of the signal of the path S2 may be greater than the data rate of the signal of the path S1. In this embodiment, the region 24*r* may function as a high speed data region, and the region 21*r* may function as a low speed data region.

Referring to FIG. 5B, the region 24*r* may be located at a peripheral region of the circuit 20. The region 21*r* may be disposed between the regions 22*r* and 24*r*. When the region 24*r* is closer to the lateral surface or edge of the circuit 20, the signal passing through the conductive structure 24 may experience reduced interference from other conductive structures. In some embodiments, the region 23*r* may be disposed between the regions 22*r* and 24*r*. The region 23*r* may be disposed between the regions 21*r* and the 22*r*. The region 23*r* may be configured to block electromagnetic interference (EMI) between the regions 21*r*, 22*r*, and 24*r*, thereby ensuring that both power and signals are unaffected by interference from adjacent circuits.

Figure 6:
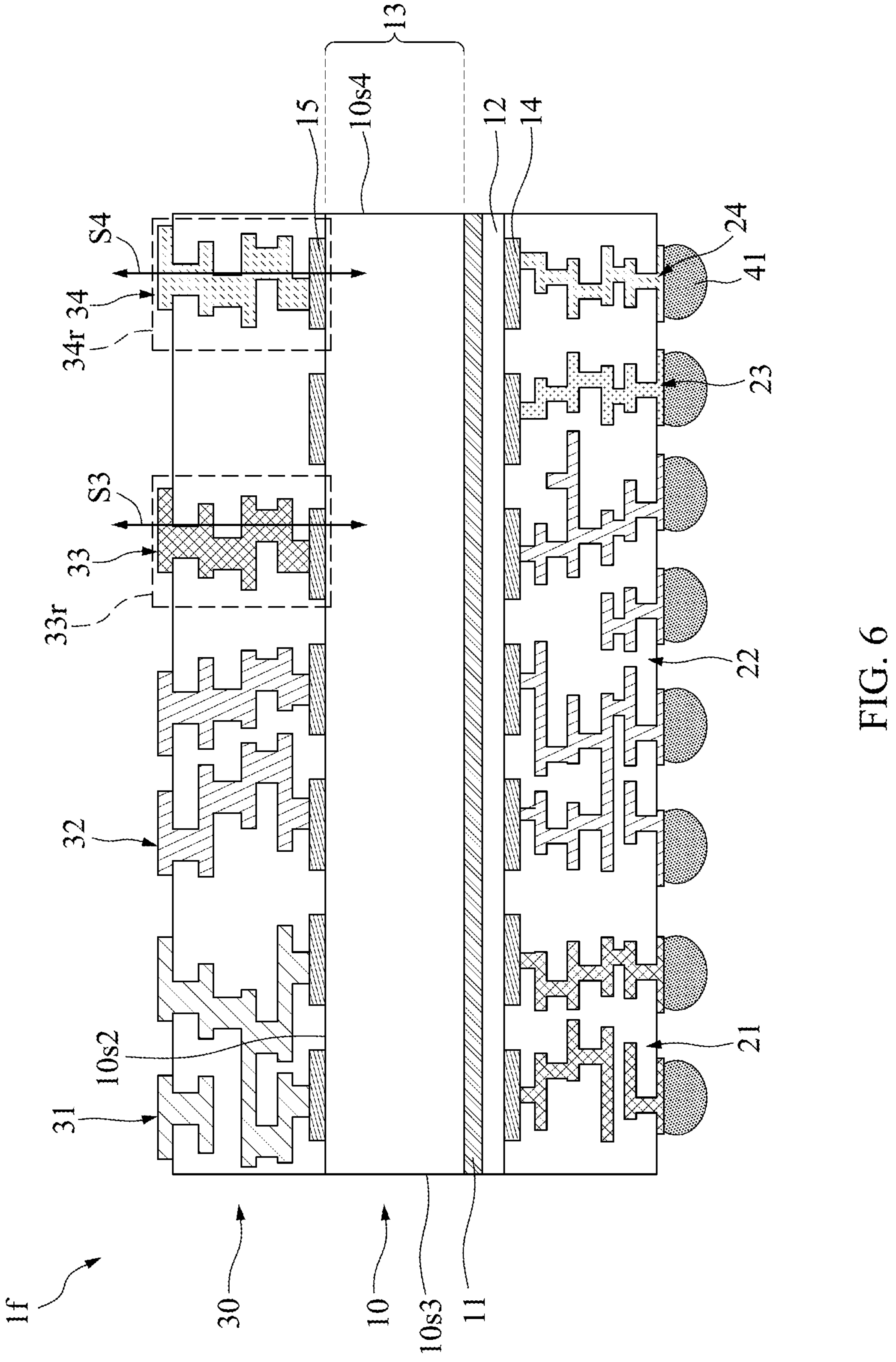
FIG. 6 illustrates a cross-sectional view of an electronic device according to some embodiments of the present disclosure.

FIG. 6 illustrates a cross-sectional view of an electronic device 1*f* according to some embodiments of the present disclosure. The electronic device 1*f* is similar to the electronic device 1*e* as shown in FIG. 5, with differences therebetween as follows.

In some embodiments, the circuit 30 may include a conductive structure 33 and a conductive structure 34. The conductive structure 33 may be located within a region 33*r*. In some embodiments, the conductive structure 33 may be configured to transceive a non-power signal with a lower data rate. In some embodiments, the electronic device 1*f* includes a path S3 for transmitting a signal. In some embodiments, the path S3 may pass through the surface 10*s*2 of the electronic component 10 and conductive structure 33.

The conductive structure 34 may be located within a region 34*r*. In some embodiments, the conductive structure 34 may be configured to transceive a non-power signal with a higher data rate. The region 34*r* is closer to the surface 10*s*4 (or the edge) of the electronic component 10 than the region 33*r* is, which facilitates the fan-out of the conductive structure 34. In some embodiments, the electronic device 1*f* includes a path S4 for transmitting a signal. In some embodiments, the path S4 may pass through the surface 10*s*2 of the electronic component 10 and conductive structure 34. In some embodiments, a data rate of the signal of the path S3 may be different from the data rate of the signal of the path S4. In some embodiments, a data rate of the signal of the path S4 may be greater than the data rate of the signal of the path S3.

In this embodiment, some of the non-power signals may be transmitted through the surface 10*s*2 of the electronic component 10 and the circuit 30, leading to a layout design that is more flexible.

Figure 7:
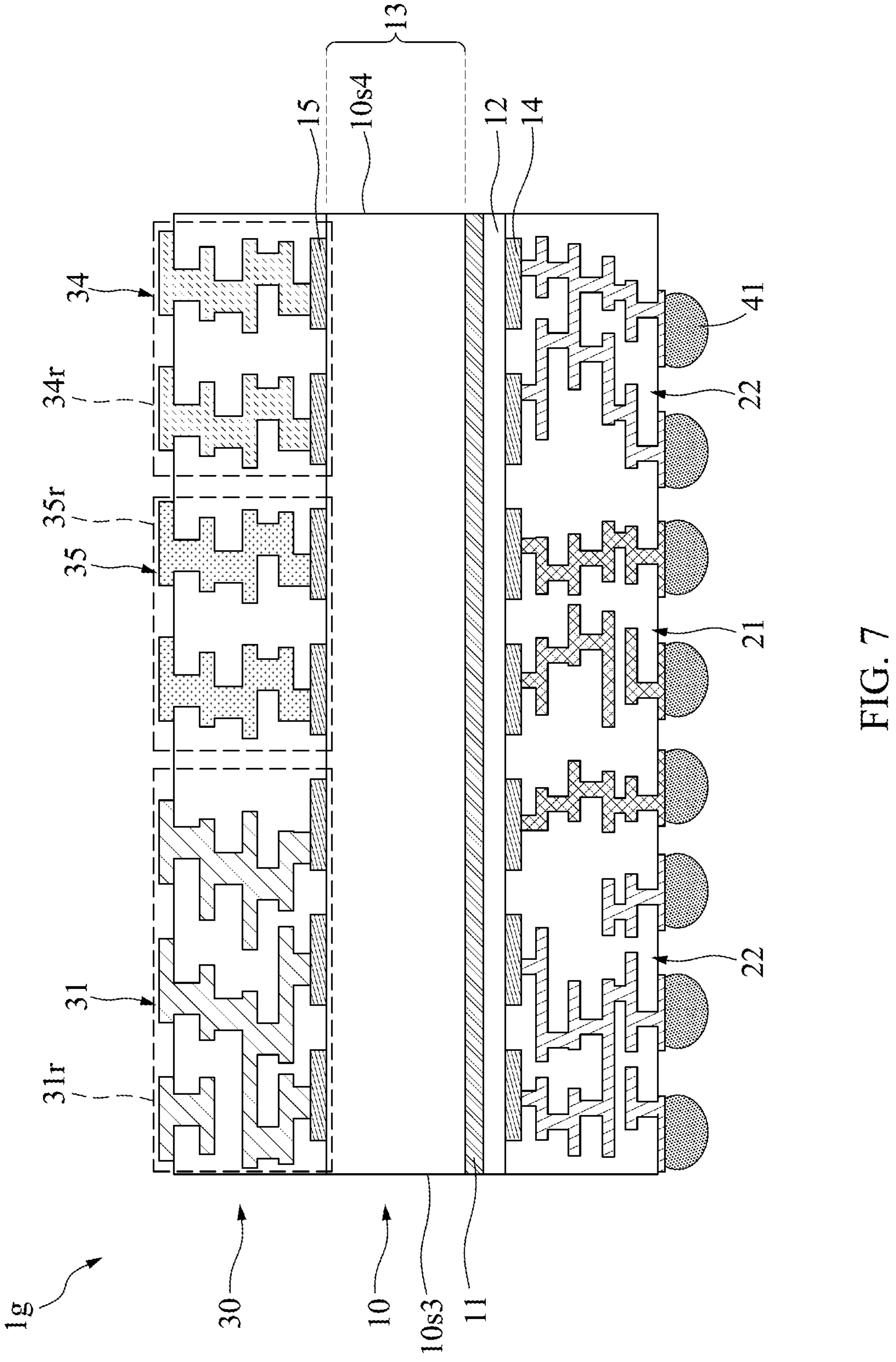
FIG. 7 illustrates a cross-sectional view of an electronic device according to some embodiments of the present disclosure.

FIG. 7 illustrates a cross-sectional view of an electronic device 1*g* according to some embodiments of the present disclosure. The electronic device 1*g* is similar to the electronic device 1*f* as shown in FIG. 6, with differences therebetween as follows.

In some embodiments, the circuit 30 may include a conductive structure 35. The conductive structure 35 may be located within a region 35*r*. The conductive structure 35 may be configured to transmit or receive a grounding signal. The conductive structure 35 may be electrically connected to ground. In some embodiments, the region 35*r* may be disposed between the region 34*r* and the region 31*r* so that the signal passing through the conductive structure 34 may be free of the interference caused by the conductive structure 31.

Figure 8:
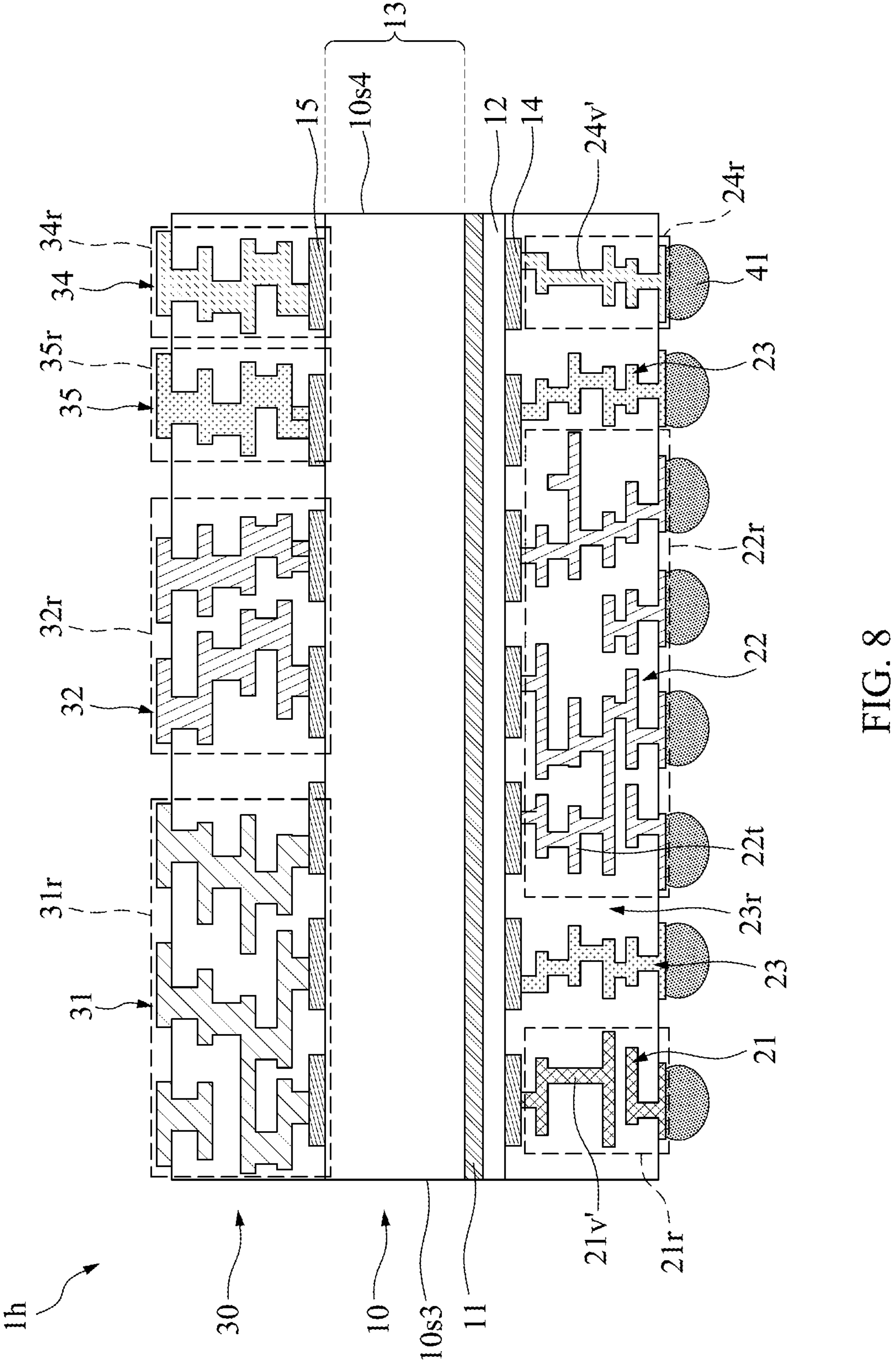
FIG. 8 illustrates a cross-sectional view of an electronic device according to some embodiments of the present disclosure.

FIG. 8 illustrates a cross-sectional view of an electronic device 1*h* according to some embodiments of the present disclosure. The electronic device 1*h* is similar to the electronic device 1*a* as shown in FIG. 1A, with differences therebetween as follows.

In some embodiments, the region 32*r* may be disposed between the regions 31*r* and 34*r*. In some embodiments, the region 32*r* may be disposed between the regions 31*r* and 35*r*. Since the distance between the trace transmitting high power (e.g., conductive structure 31) and the trace transmitting a signal with a high data rate (e.g., conductive structure 34) is relatively large, the signal with the high data rate may have less interference from the conductive structure 31.

In some embodiments, the region 22*r* may be disposed between the regions 21*r* and 24*r*. In some embodiments, the region 23*r* may be disposed between the regions 21*r* and 22*r*. In some embodiments, the region 23*r* may be disposed between the regions 22*r* and 24*r*. As a result, the power and/or signals within the regions 21*r*, 22*r*, and 24*r* may be free of interference by adjacent conductive structures.

In some embodiments, the circuit 20 may include a conductive via 21*v*' and conductive via 24*v*'. The conductive via 21*v*' (or conductive via 24') may pass through one or more dielectric layers of the dielectric structure and pass across one or more conductive traces (e.g., conductive trace 22*t*) of the circuit 20 so that the conductive via 21*v*' (or conductive via 24') may have a longer length than other conductive vias.

Figure 9:
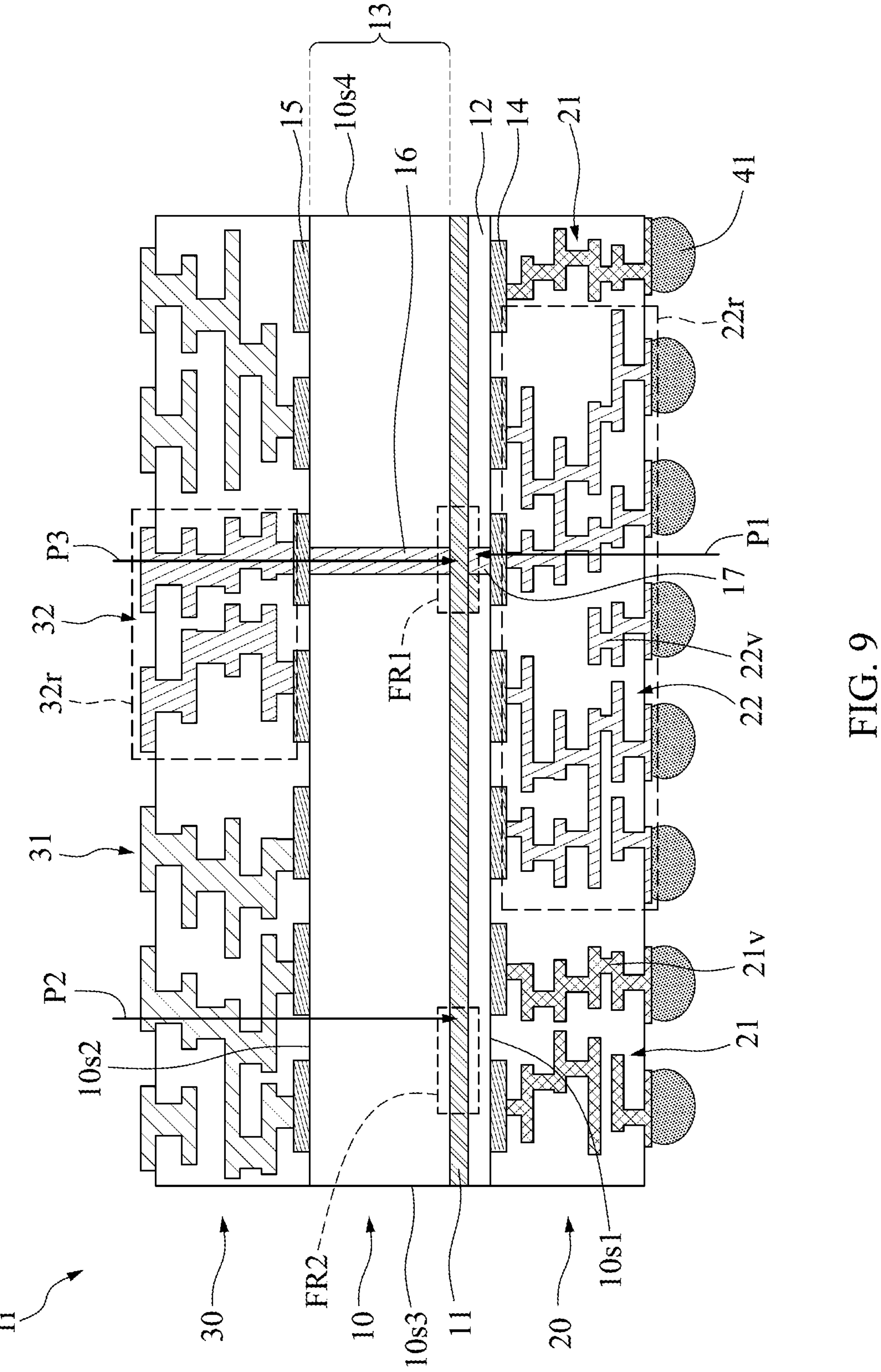
FIG. 9 illustrates a cross-sectional view of an electronic device according to some embodiments of the present disclosure.

FIG. 9 illustrates a cross-sectional view of an electronic device 1*i* according to some embodiments of the present disclosure. The electronic device 1*i* is similar to the electronic device 1*c* as shown in FIG. 3A, with differences therebetween as follows.

In some embodiments, the electronic component 10 may include interconnection structures 16 and 17. The interconnection structure 16 may be configured to electrically connect the conductive structure 32 and the functional region FR1 of the circuit layer 11. The interconnection structure 17 may be configured to electrically connect the conductive structure 22 and the functional region FR1. Each of the interconnection structures 16 and 17 may include a redistribution structure which includes a conductive via(s), conductive trace(s), or other suitable elements within a dielectric structure or a semiconductor substrate. In some embodiments, the trace within the circuit 20 may have a thickness less than that within the circuit 30.

In this embodiment, the paths P1 and P3 may pass through the functional region FR1. Both of the conductive structures 22 and 32 may provide the functional region FR1 with a non-power signal. In some embodiments, the power (or voltage) of the path P1 may be substantially the same as that of the path P3. In some embodiments, the conductive structure 22 may be electrically connected to the conductive structure 32 in parallel. Since the conductive structure 22 has a relatively small L/S, the conductive elements (e.g., conductive traces and/or vias) may be damaged caused by heat accumulation. Therefore, the conductive structure 32 may be configured to stabilize the power supply of the functional region FR1.

Figure 10:
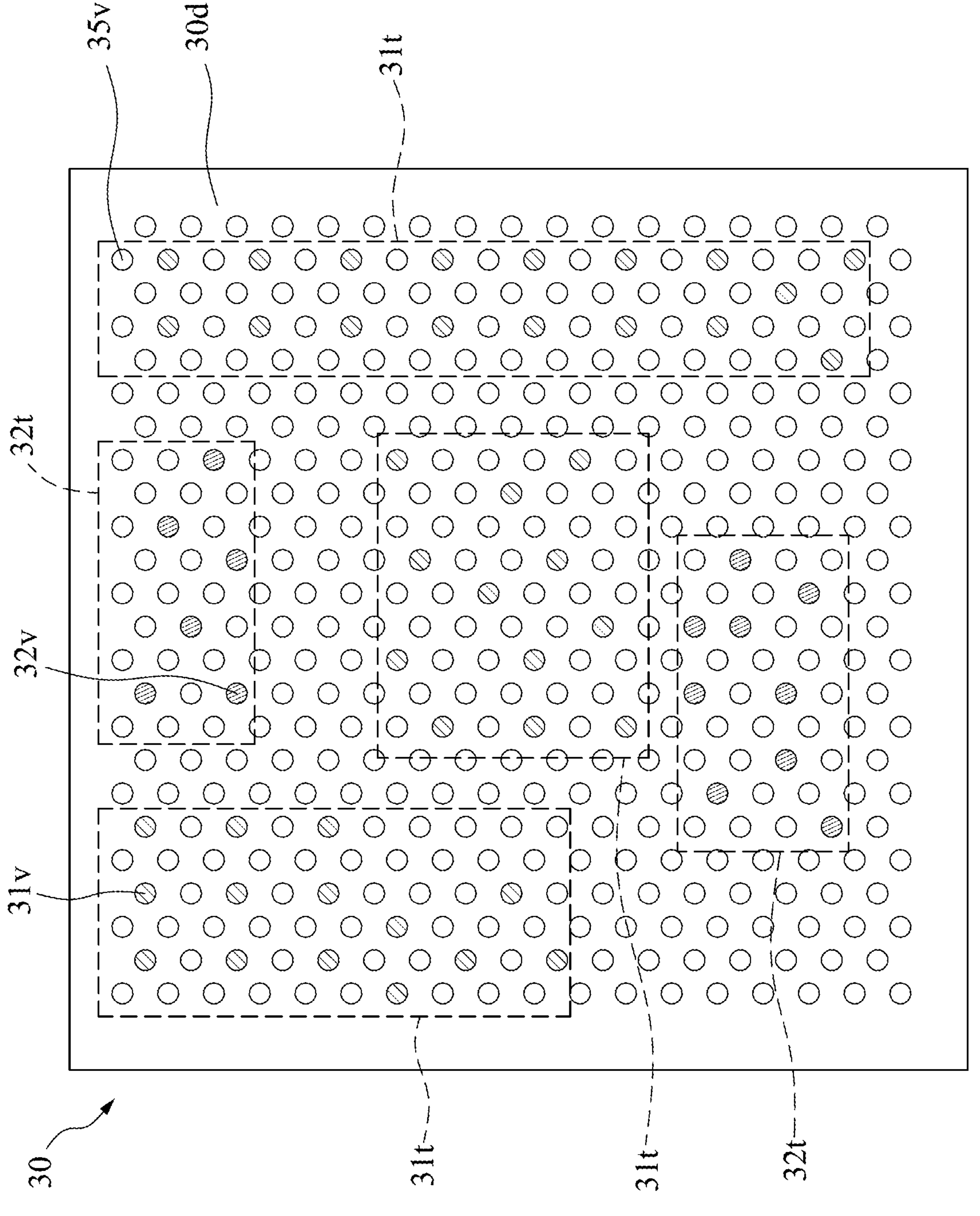
FIG. 10 illustrates a layout of an electronic device according to some embodiments of the present disclosure.

FIG. 10 illustrates a layout of an electronic device 1*j* according to some embodiments of the present disclosure.

The electronic device 1*j* may include conductive vias 35*v*. The conductive via 35*v* may be configured to transmit or receive a grounding signal. In some embodiments, one of the conductive vias 31*v* may be spaced apart from other conductive vias 31*v* (or conductive vias 32*v*) by the conductive vias 35*v*. The conductive vias 31*v*, 32*v*, and 35*v* may have the same dimension (e.g., aperture or surface area). The conductive via 35*v* may be configured to reduce the EMI between the conductive vias 31*v* and 32*v*.

In some embodiments, the electronic device 1*j* may include conductive traces 31*t* over and/or vertically overlapping the conductive vias 31*v* that are configured to transmit a relatively high power. The conductive traces 31*t* may function as an impedance matching trace and be electrically connected to the conductive vias 31*v*. The electronic device 1*j* may include conductive traces 32*t* over and vertically overlapping the conductive vias 32*v* that are configured to transmit a relatively low power. The conductive traces 32*t* may function as an impedance matching trace and be electrically connected to the conductive vias 32*v*. Although FIG. 10 illustrates that the conductive trace 31*t* overlaps the conductive via 35*v*, it should be noted that the conductive trace 31*t* is electrically isolated from the conductive via 35*v* by a dielectric material surrounding the conductive vias 35*v*.

Figure 11:
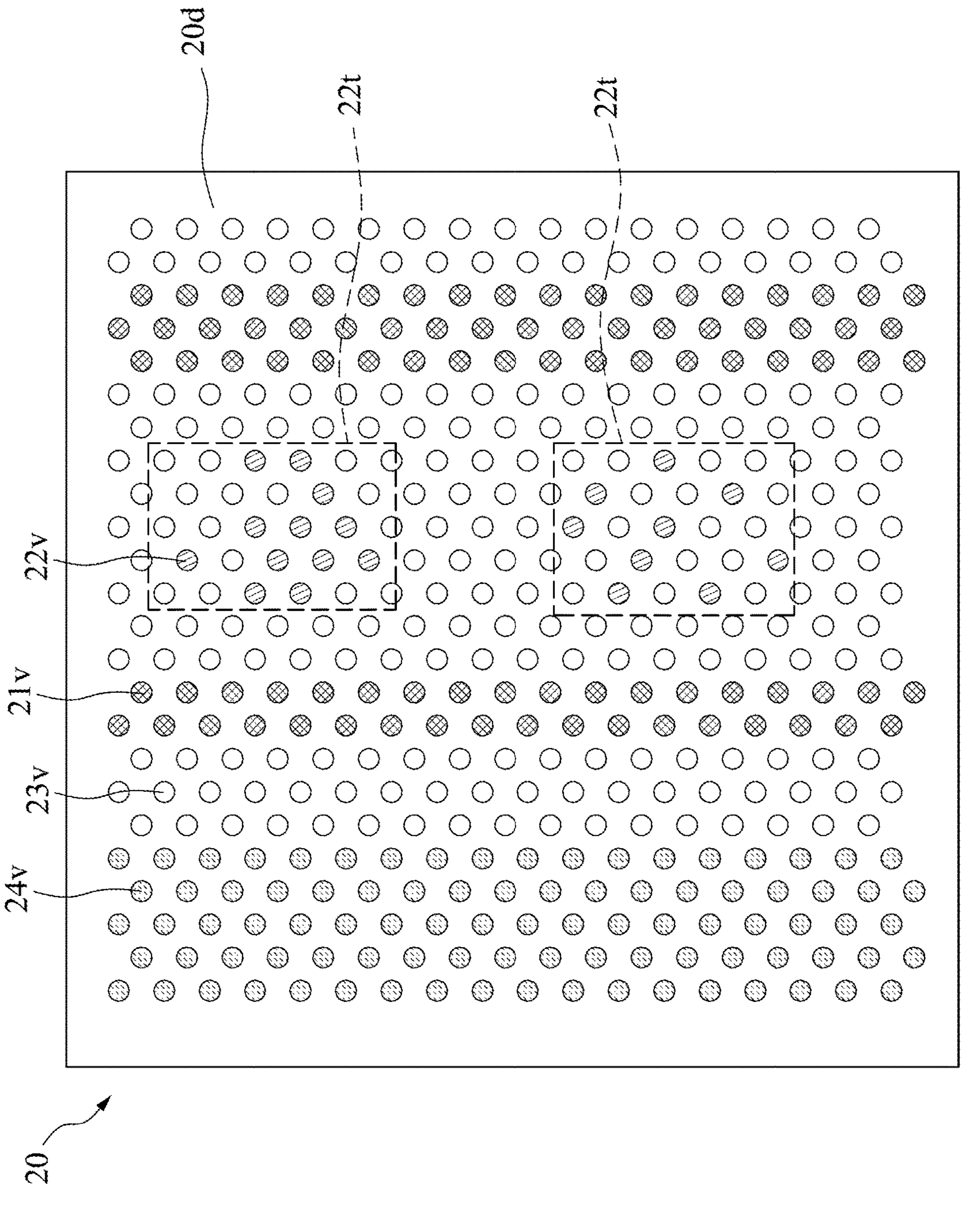
FIG. 11 illustrates a layout of an electronic device according to some embodiments of the present disclosure.

FIG. 11 illustrates a layout of an electronic device 1*k* according to some embodiments of the present disclosure.

The electronic device 1*k* may include conductive vias 23*v* and 24*v*. The conductive via 23*v* may be configured to transmit or receive a grounding signal. The conductive via 24*v* may be configured to transmit a signal of a higher data rate, and the conductive via 21*v* may be configured to transmit a signal of a lower data rate. In some embodiments, the conductive vias 23*v* may define a column (or row) between the column (or row) of the conductive vias 21*v* and column (or row) of the conductive vias 24*v*. In some embodiments, the conductive vias 22*v* may be disposed sporadically. For example, the conductive vias 22*v* are not arranged continuously and do not form a column (or row) as the conductive vias 24*v* do. The conductive vias 21*v*, 22*v*, 23*v*, and 24*v* may have the same dimension (e.g., aperture or surface area).

In some embodiments, the electronic device 1*k* may include conductive traces 22*t* vertically overlapping and electrically connected to the conductive vias 22*v* that are configured to transmit a power. The conductive trace 22*t* may function as an impedance matching trace configured to adjust the impedance of the conductive path passing through the conductive vias 22*v*. Although FIG. 11 illustrates that the conductive trace 22*t* overlaps the conductive via 23*v*, it should be noted that the conductive trace 22*t* is electrically isolated from the conductive via 23*v* by a dielectric material.

Figure 12:
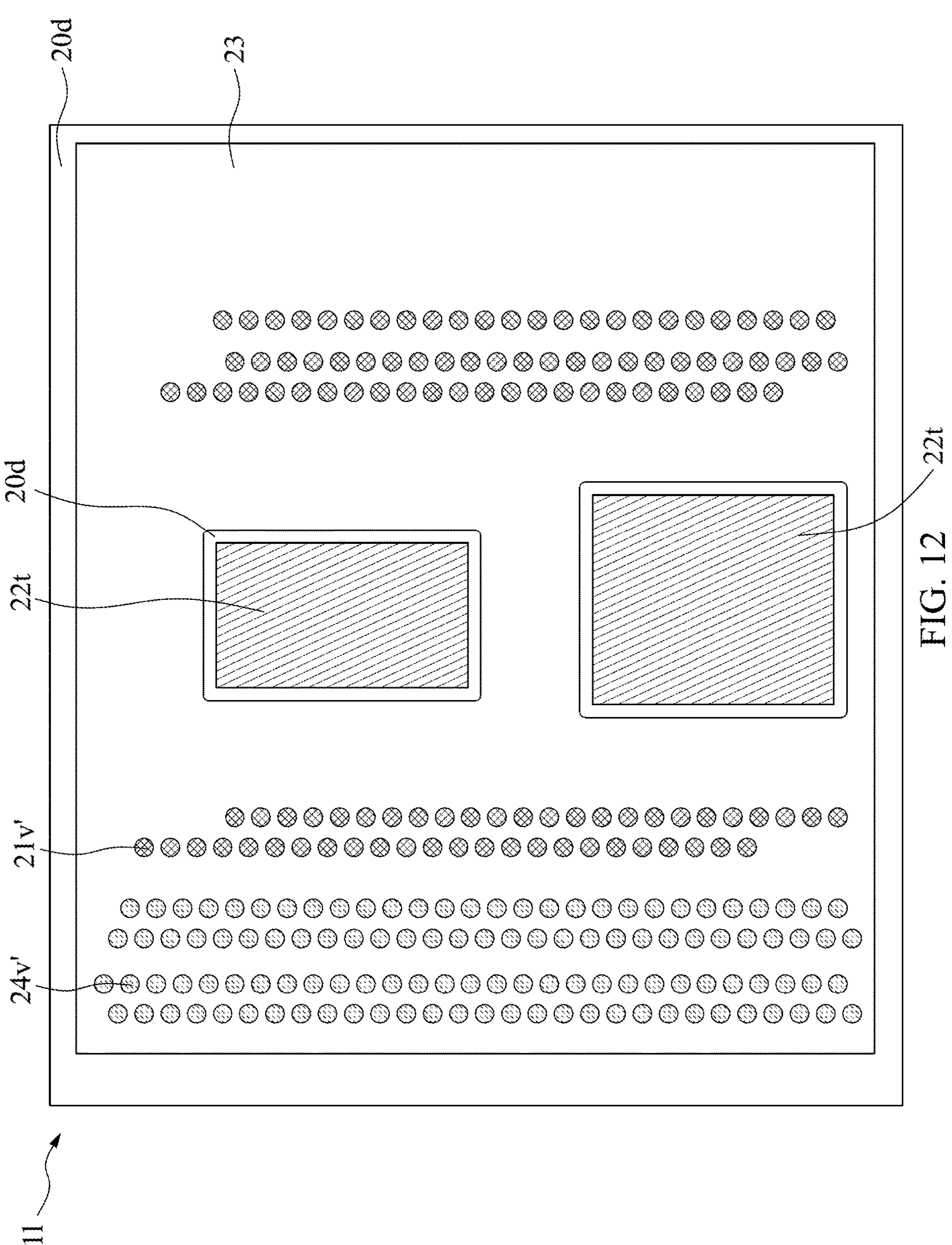
FIG. 12 illustrates a layout of an electronic device according to some embodiments of the present disclosure.

FIG. 12 illustrates a layout of an electronic device 1*l* according to some embodiments of the present disclosure.

As shown in FIG. 12, the conductive via 21*v*' and conductive via 24*v*' may be located at the same elevation (or height) as the conductive trace 22*t*. In some embodiments, the conductive via 21*v*' (or conductive via 24*v*') may pass through or across the conductive trace 22*t* as shown in FIG. 8. Although not shown in FIG. 12, it should be noted that the conductive via 21*v*' (or conductive via 24') may be spaced apart from the conductive structure 23 by the dielectric structure 20*d*.

Figure 13:
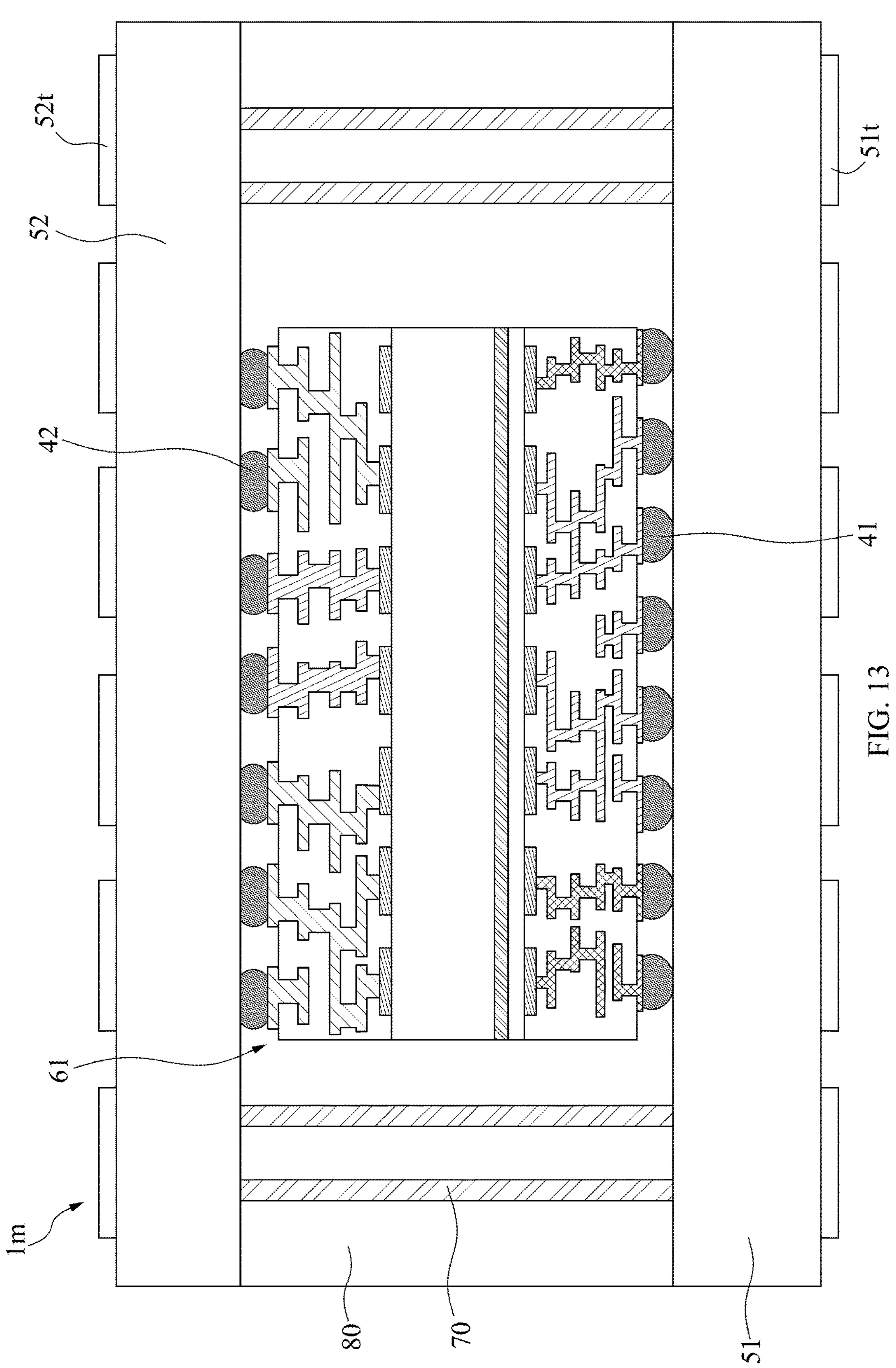
FIG. 13 illustrates a cross-sectional view of an electronic device according to some embodiments of the present disclosure.

FIG. 13 illustrates a cross-sectional view of an electronic device 1*m* according to some embodiments of the present disclosure. The electronic device 1*m* may include a carrier 51, a carrier 52, a circuit structure 61, conductive elements 70, and an encapsulant 80.

The carrier 51 may be formed of, for example, a printed circuit board, such as a paper-based copper foil laminate, a composite copper foil laminate, or a polymer-impregnated glass-fiber-based copper foil laminate. The carrier 51 may include a redistribution layer (RDL) or traces, for electrical connection between components. The carrier 51 may include terminals 51$t$ configured to be electrically connected to an external device (not shown).

The circuit structure 61 may be supported by the carrier 51. In some embodiments, the circuit structure 61 may be one of the electronic devices 1$a$ to 1$i$ as shown in FIG. 1A to FIG. 9. The circuit structure 61 may be electrically connected to the carrier 51 through the terminals 41. Power may be transmitted between the carrier 51 and the circuit structure 61. A non-power signal (e.g., I/O signal) may be transmitted between the carrier 51 and the circuit structure 61.

The conductive elements 70 may be disposed on or over the carrier 51. The conductive element 70 may penetrate the encapsulant 80. The conductive element 70 may be configured to transmit power and/or a non-power signal. The conductive element 70 may include, for example, a conductive pillar composed of a seed layer (e.g., titanium nitride) and a copper pillar.

The encapsulant 80 may be disposed between the carrier 51 and carrier 52. The encapsulant 80 may include insulation or dielectric material. In some embodiments, the encapsulant 80 may be made of molding material that may include, for example, a Novolac-based resin, an epoxy-based resin, a silicone-based resin, or another suitable encapsulant. Suitable fillers may also be included, such as powdered $SiO_2$.

The carrier 52 may be disposed on or over the encapsulant 80. The carrier 52 may be formed of, for example, a printed circuit board, such as a paper-based copper foil laminate, a composite copper foil laminate, or a polymer-impregnated glass-fiber-based copper foil laminate. The carrier 52 may include a redistribution layer (RDL) or traces, for electrical connection between components. The carrier 52 may include terminals 52$t$ configured to be electrically connected to an external device (not shown).

The carrier 52 may be configured to transmit power and/or a non-power signal to the circuit structure 61. In some embodiments, the circuit structure 61 may be electrically connected to the carrier 52 through terminals 42.

Figure 14:
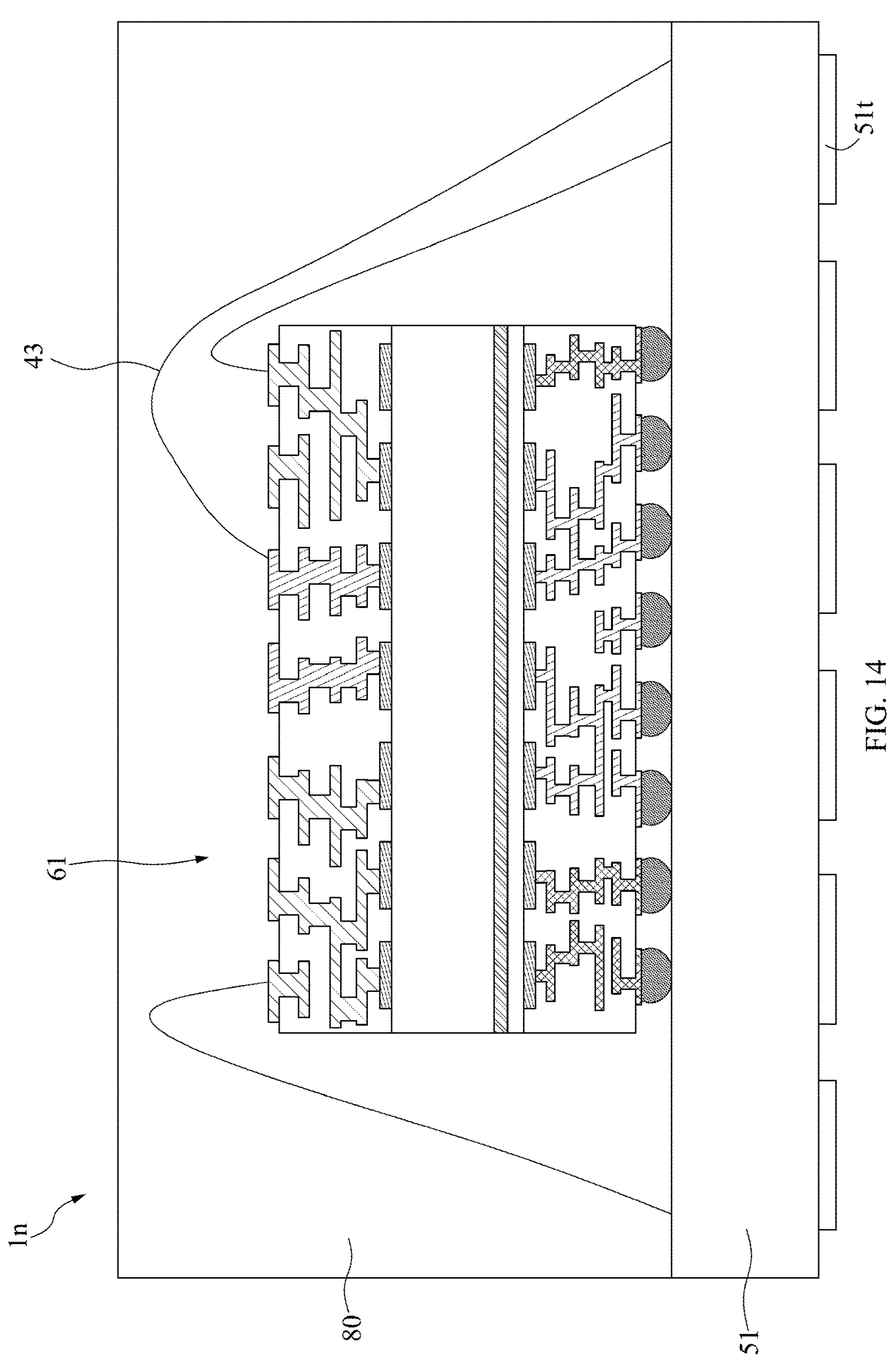
FIG. 14 illustrates a cross-sectional view of an electronic device according to some embodiments of the present disclosure.

FIG. 14 illustrates a cross-sectional view of an electronic device 1$n$ according to some embodiments of the present disclosure.

In some embodiments, the electronic device 1$n$ may include bonding wires 43. The bonding wire 43 may be encapsulated by the encapsulant 80. In some embodiments, the bonding wire 43 may connect the circuit structure 61 to the carrier 51. The bonding wire 43 may be configured to transmit power and/or a non-power signal.

Figure 15:
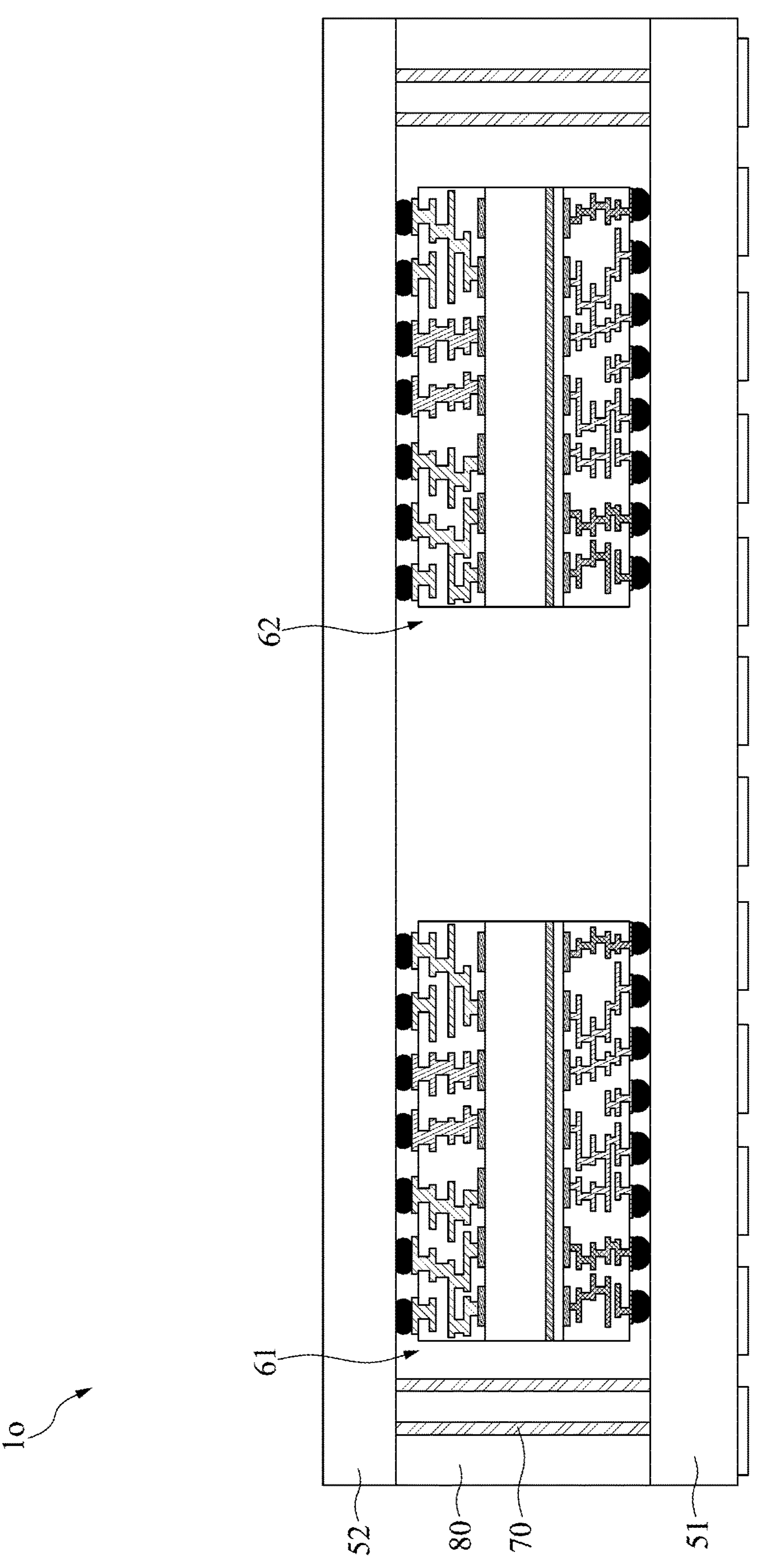
FIG. 15 illustrates a cross-sectional view of an electronic device according to some embodiments of the present disclosure.

FIG. 15 illustrates a cross-sectional view of an electronic device 1$o$ according to some embodiments of the present disclosure.

In some embodiments, the electronic device 1$n$ may include a circuit structure 62. The circuit structure 62 may be supported by the carrier 51. In some embodiments, the circuit structure 62 may be one of the electronic devices 1$a$ to 1$i$ as shown in FIG. 1A to FIG. 9. In some embodiments, the circuit structure 61 may be in communication with the circuit structure 62 through the carrier 51 and/or carrier 52. For example, a signal (e.g., I/O signal) may be transmitted between the circuit structures 61 and 62.

Figure 16:
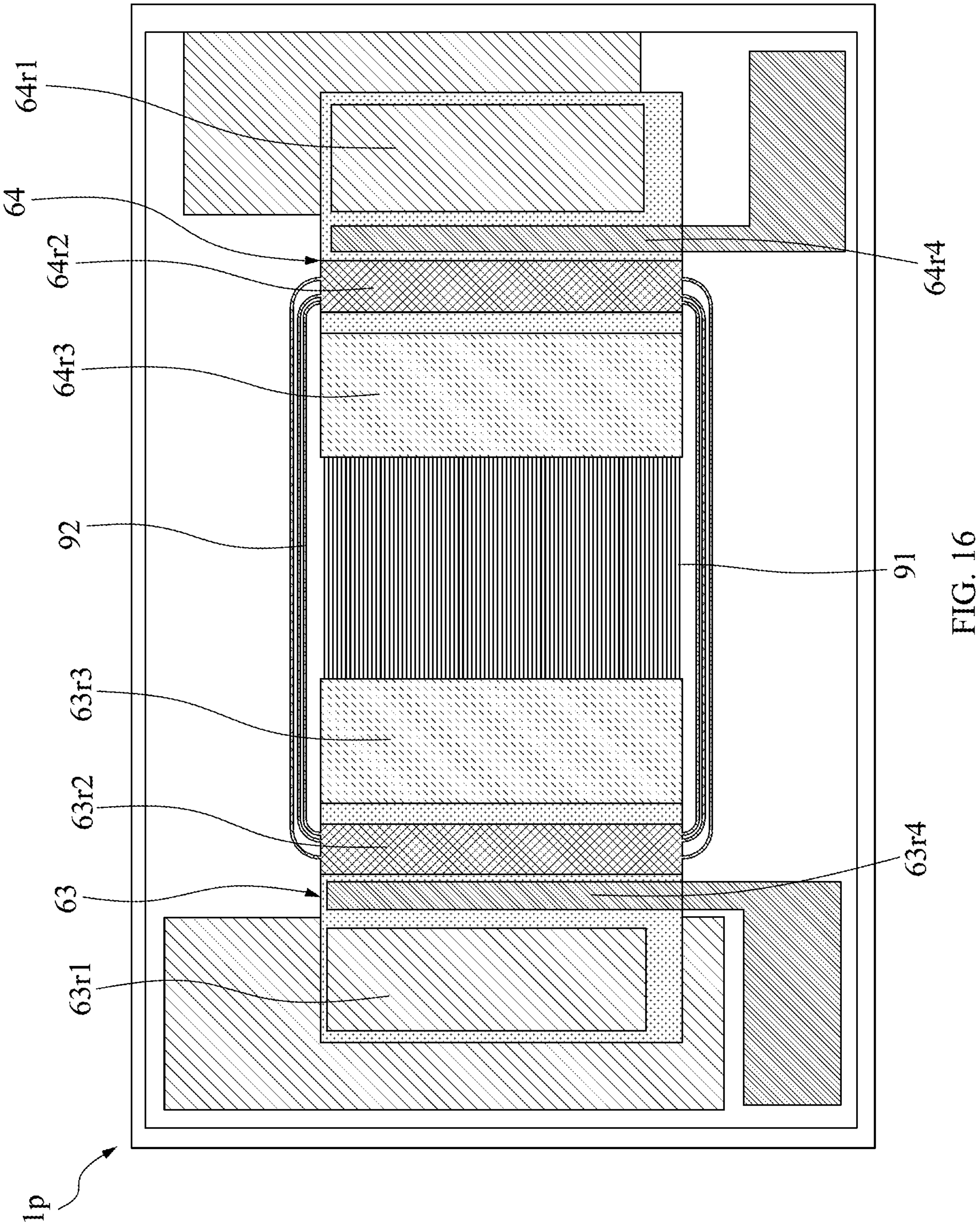
FIG. 16 illustrates a layout of an electronic device according to some embodiments of the present disclosure.

FIG. 16 illustrates a layout of an electronic device 1$p$ according to some embodiments of the present disclosure.

The electronic device 1$p$ may include a circuit structure 63 and a circuit structure 64. Each of the circuit structures 63 and 64 may be one of the electronic devices 1$a$ to 1$i$ as shown in FIG. 1A to FIG. 9. The circuit structure 63 may include regions 63$r$1, 63$r$2, 63$r$3 and 63$r$4. The circuit structure 64 may include regions 64$r$1, 64$r$2, 64$r$3, and 64$r$4. The conductive elements of the regions 63$r$1 and 64$r$1 may be configured to transmit power (e.g., power greater than 3.3V). The regions 63$r$2 and 64$r$2 may be configured to transmit a signal of a lower data rate. The regions 63$r$3 and 64$r$3 may be configured to transmit a signal of a higher data rate. The conductive elements of the regions 63$r$4 and 64$r$4 may be configured to transmit power (e.g., power less than 3.3V). The region 63$r$3 may be in communication with the region 64$r$3 through an electrical interconnection 91. The region 63$r$2 may be in communication with the region 64$r$2 through an electrical interconnection 92. In this embodiment, the region 63$r$3 (or region 64$r$3) is closer to the edge of the circuit structure 63 (or circuit structure 64) than the region 63$r$2 (or region 64$r$2) is, leading to a reduced transmission path of a high data rate signal. The layout of FIG. 16 may be applicable to the electronic device 1$o$ as shown in FIG. 15. For example, the circuit structures 63 and 64 may correspond to the circuit structures 61 and 62, respectively. The electrical interconnections 91 and 92 of FIG. 16 may be formed within the carrier 51 and electrically connected between the circuit structures 61 and 62 of FIG. 15. The traces (not shown) other than those within the regions 63$r$1, 63$r$2, 63$r$3, 63$r$4, 64$r$1, 64$r$2, 64$r$3, and 64$r$4 may be formed within the carriers 51 and/or 52.

Figure 17:
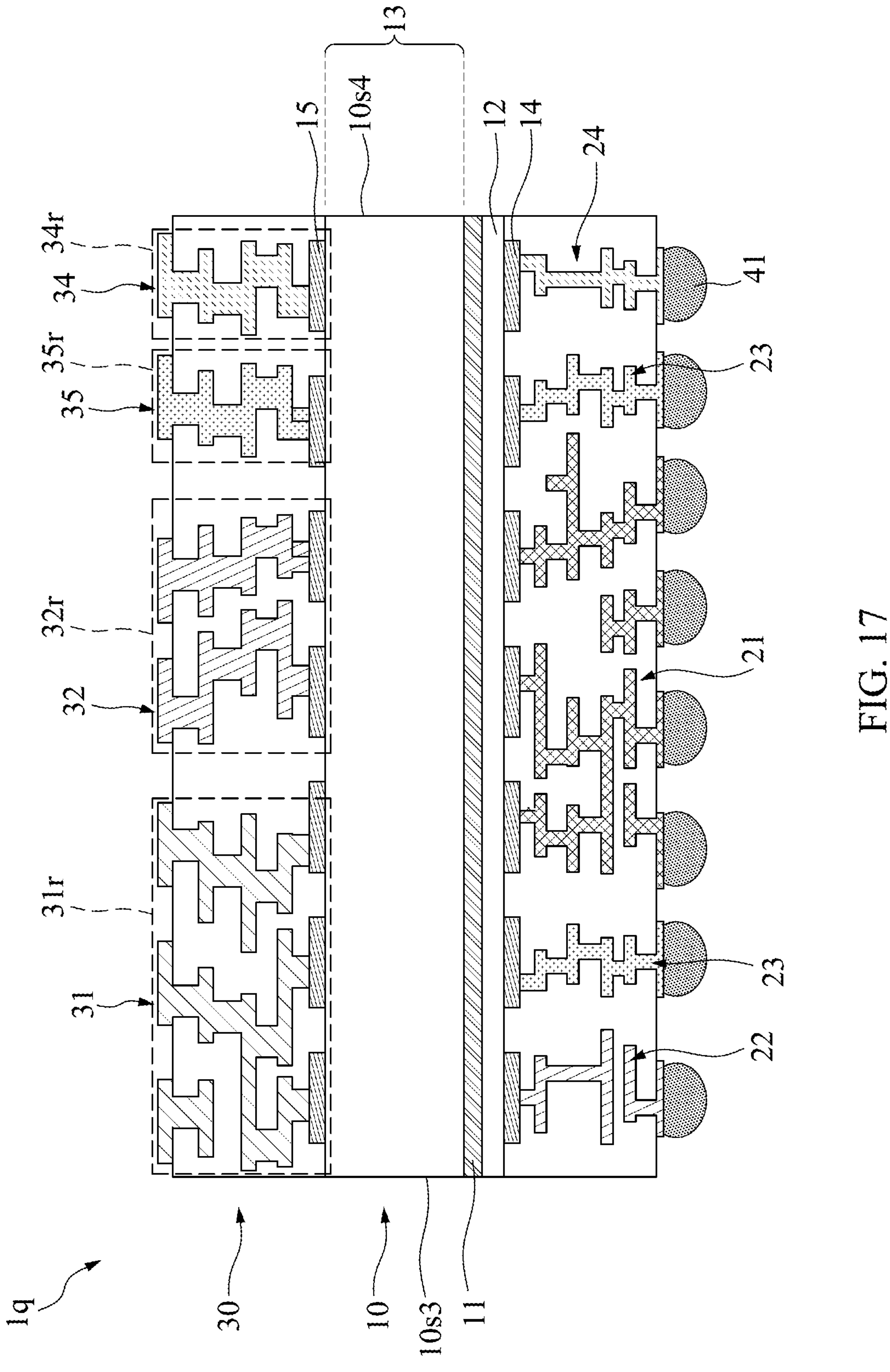
FIG. 17 illustrates a cross-sectional view of an electronic device according to some embodiments of the present disclosure.

FIG. 17 illustrates a cross-sectional view of an electronic device 1$q$ according to some embodiments of the present disclosure. In some embodiments, the conductive structure 21 may be spaced apart from the conductive structure 22 by the conductive structure 23, which is electrically connected to ground, and spaced apart from the conductive structure 24 by the conductive structure 23, which thereby reduces the interference.

Figure 18:
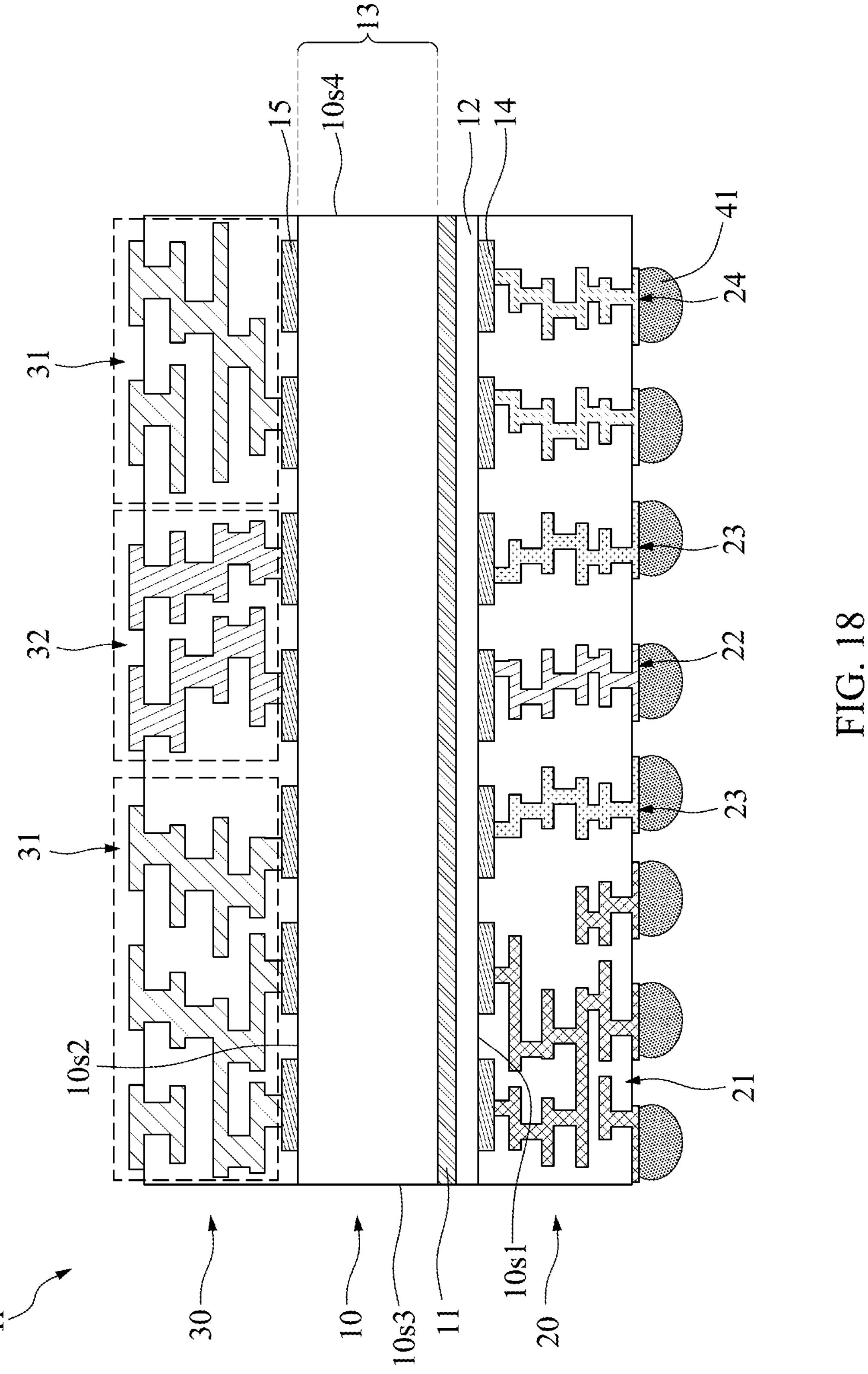
FIG. 18 illustrates a cross-sectional view of an electronic device according to some embodiments of the present disclosure.

FIG. 18 illustrates a cross-sectional view of an electronic device 1$r$ according to some embodiments of the present disclosure. In some embodiments, the conductive structure 22 may be spaced apart from the conductive structure 24 by the conductive structure 23, which thereby reduces the interference.

Figure 19:
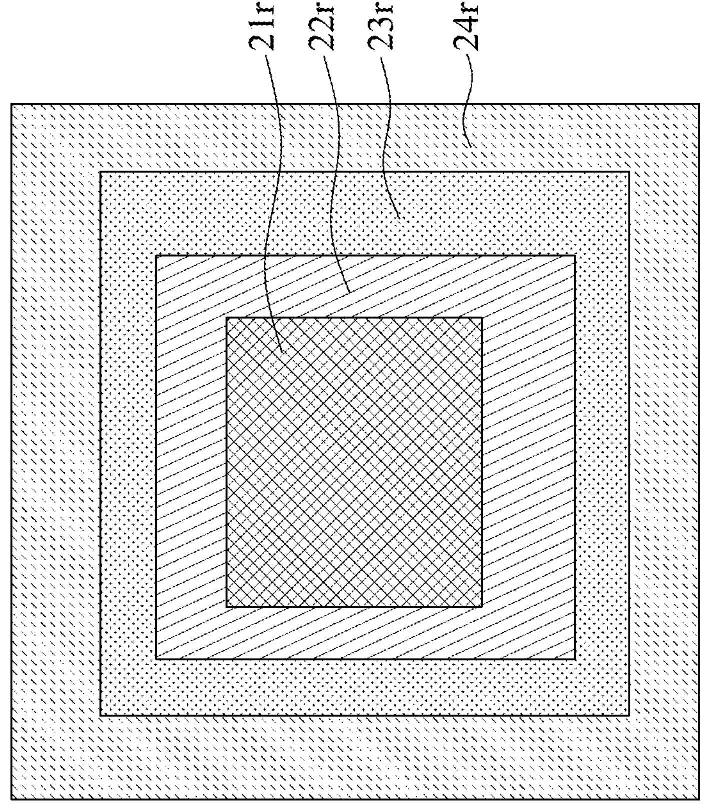
FIG. 19 illustrates a layout of an electronic device according to some embodiments of the present disclosure.
Figure 19:
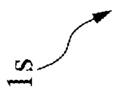

FIG. 19 illustrates a layout of an electronic device 1$s$ according to some embodiments of the present disclosure. The region 22$r$ may surround the region 21$r$. The region 23$r$ may surround the region 22$r$. The region 24$r$ may surround the region 23$r$. The region 23$r$ may be disposed between the regions 22$r$ and 24$r$.

Figure 20:
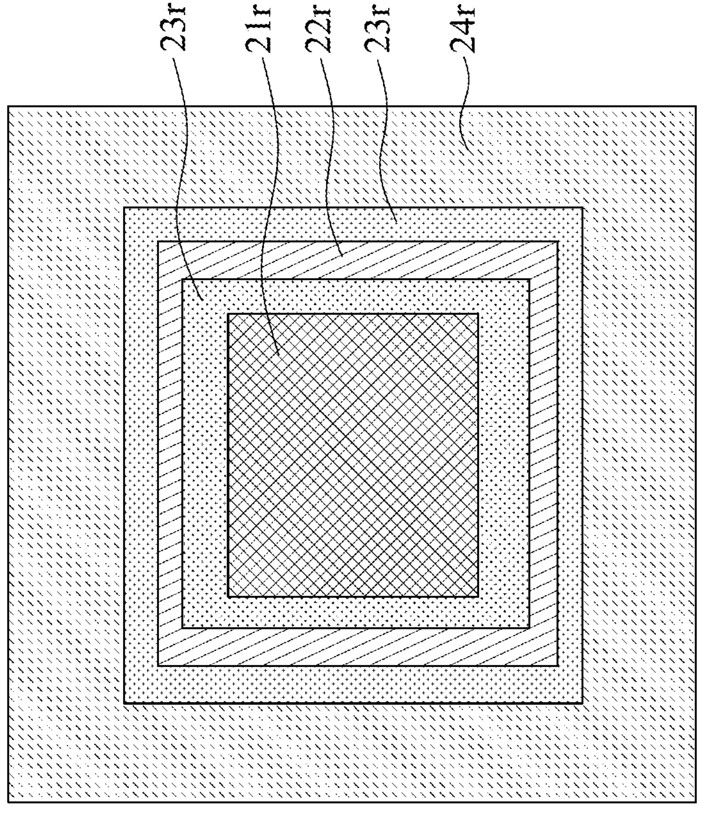
FIG. 20 illustrates a layout of an electronic device according to some embodiments of the present disclosure.
Figure 20:

FIG. 20 illustrates a layout of an electronic device 1$t$ according to some embodiments of the present disclosure. The region 23$r$ may be disposed between the regions 21$r$ and 22$r$. The region 23$r$ may be adjacent to the region 21$r$.

Figure 21:
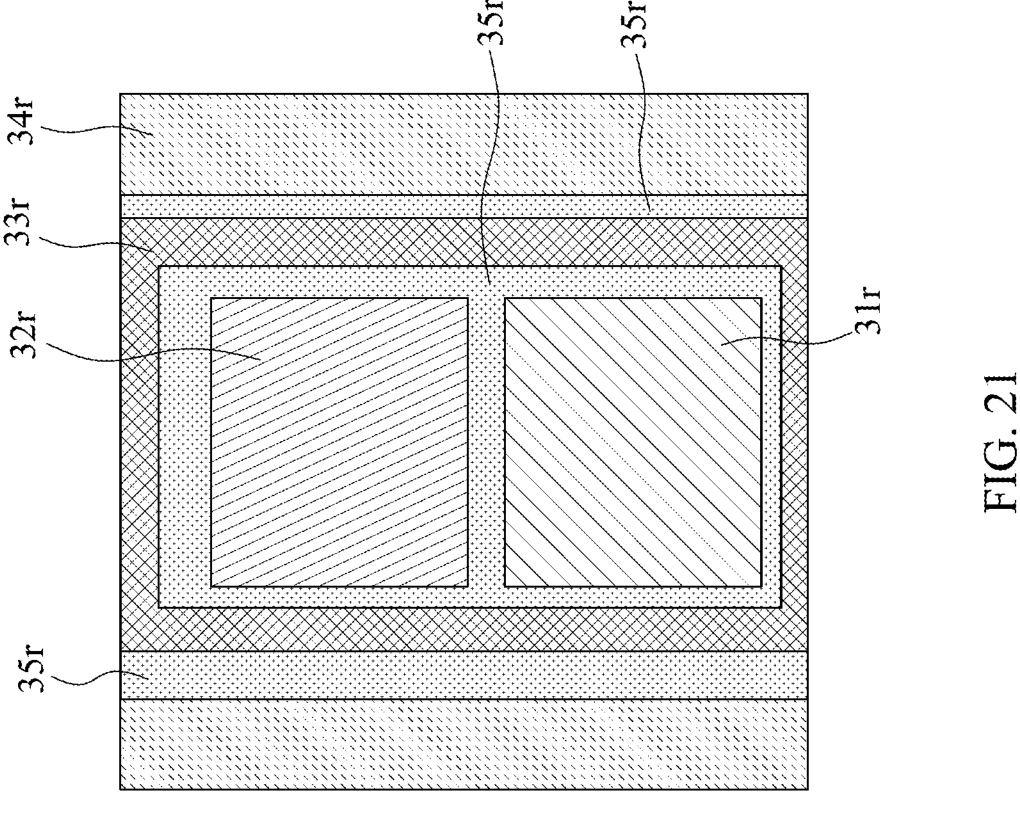
FIG. 21 illustrates a layout of an electronic device according to some embodiments of the present disclosure.

FIG. 21 illustrates a layout of an electronic device 1$u$ according to some embodiments of the present disclosure. The region 35$r$ may separate the region 31$r$ from the region 32$r$. The region 35$r$ may surround the region 31$r$. The region 35$r$ may surround the region 32$r$. The region 35$r$ may be disposed between the regions 33$r$ and 34$r$.

Figure 22:
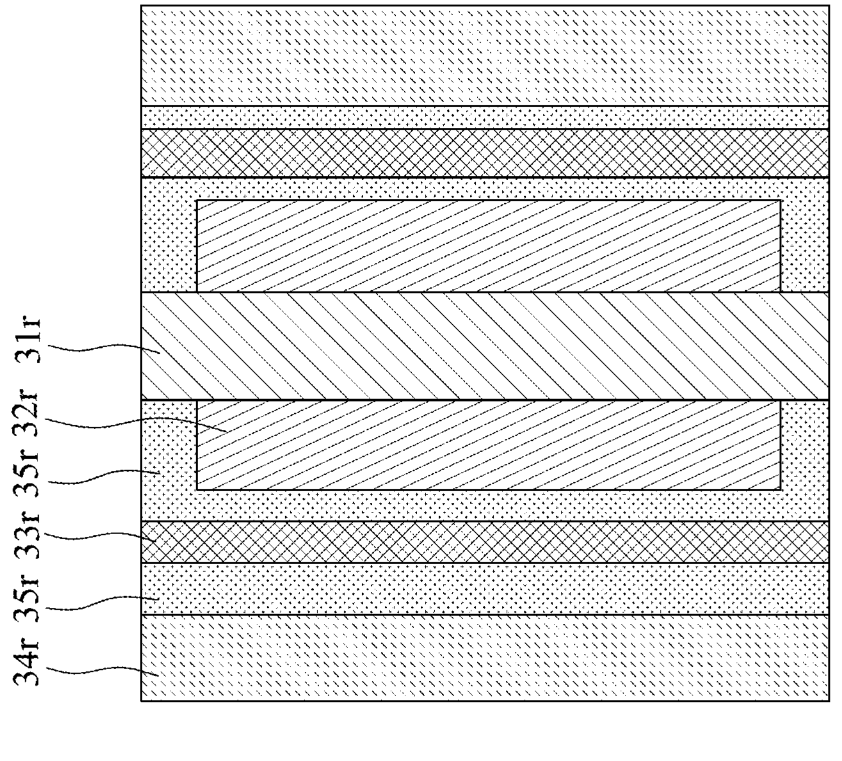
FIG. 22 illustrates a layout of an electronic device according to some embodiments of the present disclosure.

FIG. 22 illustrates a layout of an electronic device 1$v$ according to some embodiments of the present disclosure. The region 33$r$ may be spaced apart from the region 34$r$ by the region 35$r$. The region 33$r$ may be spaced apart from the region 32$r$ by the region 35$r$. The region 33$r$ may be spaced apart from the region 31$r$ by the region 35$r$. The region 31$r$ may be adjacent to the region 32$r$.

Figure 23:
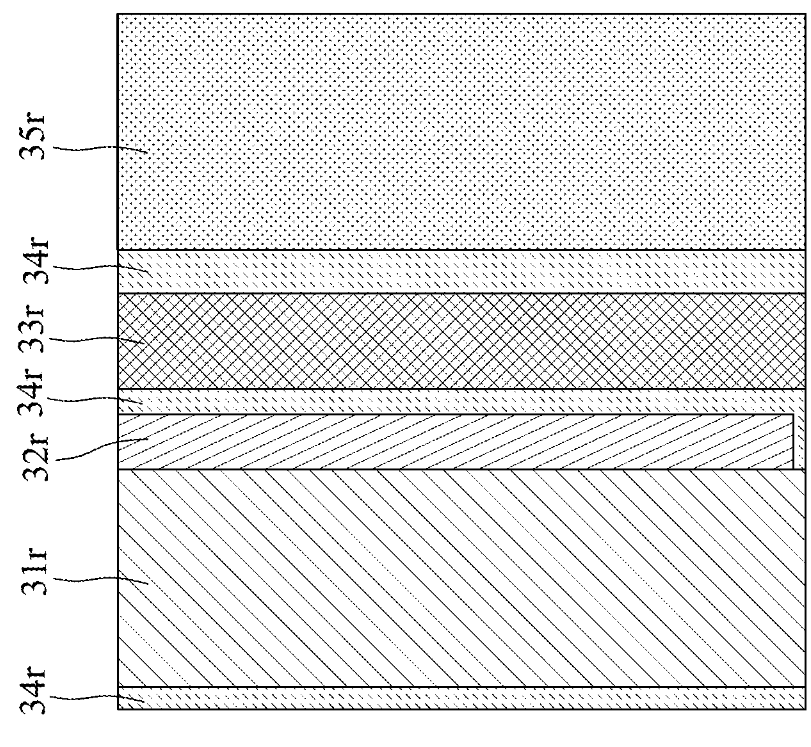
FIG. 23 illustrates a layout of an electronic device according to some embodiments of the present disclosure.
Figure 23:
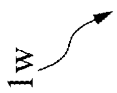

FIG. 23 illustrates a layout of an electronic device 1$w$ according to some embodiments of the present disclosure.

The region 34r may be disposed between the regions 33r and 35r. The region 34r may be disposed between the regions 32r and 33r. The region 34r may be adjacent to the region 31r.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of arrangements of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:

an electronic component having a front side and a backside opposite to the front side, wherein the front side is configured to receive a first power, and the backside is configured to receive a second power greater than the first power;

a first circuit disposed adjacent to the front side, wherein the first circuit comprises a first region configured to receive the first power and a second region configured to transceive a first non-power signal, wherein the first circuit comprises a third region configured to transceive a second non-power signal, wherein a data rate of the second non-power signal is different from a data rate of the first non-power signal, and wherein the second region is disposed between the first region and the third region and the data rate of the first non-power signal is less than the data rate of the second non-power signal.

2. The electronic device of claim 1, wherein the first region is located at a central region of the first circuit, and the second region is located at a peripheral region of the first circuit.

3. The electronic device of claim 1, wherein the first circuit comprises a fourth region configured to block an electromagnetic interference between the first region, the second region, and the third region.

4. The electronic device of claim 1, further comprising:

a second circuit adjacent to the backside, wherein a density of the second circuit is less than a density of the first circuit.

5. The electronic device of claim 4, wherein a line width/line space (L/S) of the second circuit is greater than that of the first circuit.

6. The electronic device of claim 4, wherein a thickness of a trace of the second circuit is greater than that of a trace of the first circuit.

7. An electronic device, comprising:

an electronic component having a front side and a backside opposite to the front side, wherein the front side is configured to receive a first power, and the backside is configured to receive a second power greater than the first power;

a first circuit disposed adjacent to the front side, wherein the first circuit comprises a first region configured to receive the first power and a second region configured to transceive a first non-power signal; and a second circuit adjacent to the backside, wherein the second circuit comprises a first region configured to receive the second power and a second region configured to receive a third power different from the second power.

8. An electronic device, comprising:

an electronic component having a front side and a backside;

a first circuit under the front side and configured to provide a first functional region of the electronic component with a first power; and a second circuit over the backside and configured to provide a second functional region of the electronic component with a second power, wherein a density of the first circuit is less than that of the second circuit, wherein the first circuit is further configured to transceive a non-power signal, and wherein the first circuit comprises a high speed data region and a low speed data region, and the high speed data region is closer to an edge of the first circuit than the low speed data region is.

9. The electronic device of claim 8, wherein the first circuit comprises a power transmission region disposed between the low speed data region and the high speed data region.

10. The electronic device of claim 8, wherein the second circuit is further configured to provide the first functional region of the electronic component with a third power less than the second power.

11. The electronic device of claim 10, wherein the second circuit comprises a first impedance matching trace configured to transmit the second power and a second impedance matching trace configured to transmit the third power, and a dimension of the first impedance matching trace is greater than a dimension of the second impedance matching trace in a cross-sectional view.

12. The electronic device of claim 8, wherein the second circuit vertically overlaps the first functional region and the second functional region.

* * * * *